(12) United States Patent
Ock

(10) Patent No.: US 11,848,057 B2
(45) Date of Patent: Dec. 19, 2023

(54) MEMORY SYSTEM AND METHOD OF OPERATING THE SAME

(71) Applicant: SK hynix Inc., Icheon (KR)

(72) Inventor: Eun Jae Ock, Icheon (KR)

(73) Assignee: SK hynix Inc., Icheon (KR)

( * ) Notice: Subject to any disclaimer, the term of this patent is extended or adjusted under 35 U.S.C. 154(b) by 116 days.

(21) Appl. No.: 17/514,848

(22) Filed: Oct. 29, 2021

(65) Prior Publication Data

US 2022/0375531 A1    Nov. 24, 2022

(30) Foreign Application Priority Data

May 21, 2021    (KR) ................. 10-2021-0065767

(51) Int. Cl.
*G11C 16/34* (2006.01)
*G11C 16/30* (2006.01)
*G11C 29/12* (2006.01)
*G11C 29/42* (2006.01)
*G11C 16/26* (2006.01)

(52) U.S. Cl.
CPC .......... *G11C 16/3404* (2013.01); *G11C 16/26* (2013.01); *G11C 16/30* (2013.01); *G11C 29/1201* (2013.01); *G11C 29/42* (2013.01)

(58) Field of Classification Search
CPC .............................................. G11C 16/3404
See application file for complete search history.

(56) References Cited

U.S. PATENT DOCUMENTS

| 2015/0242143 A1* | 8/2015 | Kim ...................... G06F 3/0679 |
| | | 714/704 |
| 2015/0268871 A1* | 9/2015 | Shu ...................... G06F 12/0246 |
| | | 711/103 |
| 2016/0012918 A1* | 1/2016 | Mun ....................... G11C 29/44 |
| | | 714/718 |
| 2016/0155516 A1* | 6/2016 | Chang .................. G11C 16/349 |
| | | 714/721 |

FOREIGN PATENT DOCUMENTS

| KR | 10-2018-0085107 A | 7/2018 |
| KR | 10-2021-0054396 A | 5/2021 |

* cited by examiner

*Primary Examiner* — Douglas King

(57) ABSTRACT

Provided herein may be a memory system and a method of operating the same. The memory system may include a memory device including a plurality of memory blocks, the memory device being configured to output voltage information indicating whether an unstable state of an input voltage has occurred, the input voltage being provided to the memory device from an external power source, and a memory controller configured to store a read count indicating a number of times that one or more read operations are performed on each of the plurality of memory blocks and to control the memory device to move data stored in a first memory block for which the read count exceeds a threshold count to a second memory block, and configured to adjust the threshold count based on the voltage information.

20 Claims, 15 Drawing Sheets

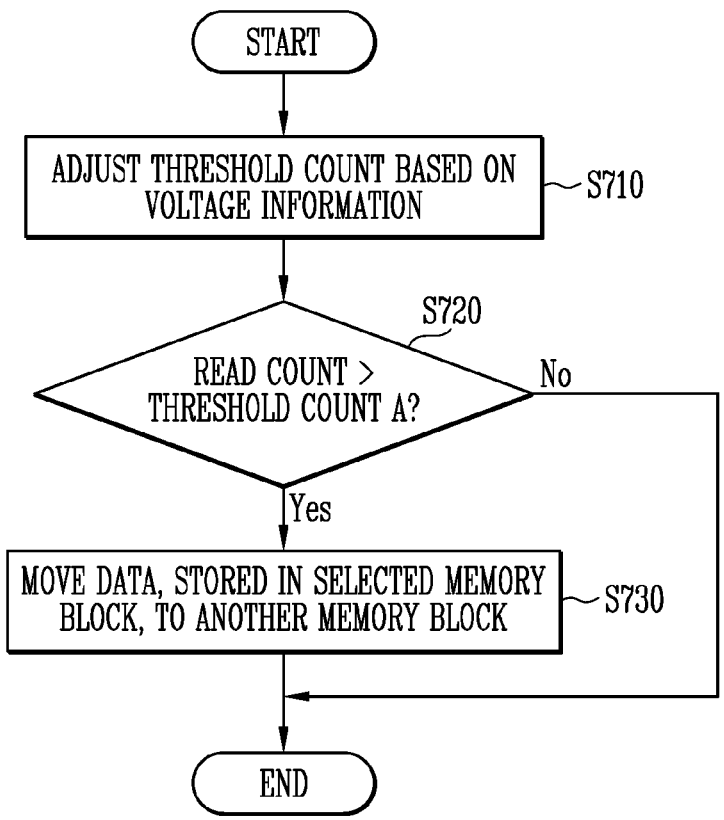

FIG. 9

| Block | Read Count |
|-------|------------|
| Blk1  | RC1        |
| Blk2  | RC2        |
| Blk3  | RC3        |
| Blk4  | RC4        |
| ...   | ...        |

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2021-0065767, filed on May 21, 2021, which is incorporated herein by reference in its entirety.

BACKGROUND

1. Technical Field

Various embodiments of the present disclosure generally relate to an electronic device, and more particularly to a memory system including a memory device and a memory controller, and a method of operating the memory system.

2. Related Art

A memory system is a device which stores data under the control of a host device such as a computer or a smartphone. The memory system may include a memory device which stores data and a memory controller which controls the memory device. Memory devices may be classified into a volatile memory device and a nonvolatile memory device.

The volatile memory device may be a memory device in which data is stored only when power is supplied and in which stored data is lost when the supply of power is interrupted. Examples of the volatile memory device may include a static random access memory (SRAM) and a dynamic random access memory (DRAM).

The nonvolatile memory device may be a memory device in which stored data is retained even when the supply of power is interrupted. Examples of the nonvolatile memory device may include a read only memory (ROM), a programmable ROM (PROM), an electrically programmable ROM (EPROM), an electrically erasable and programmable ROM (EEPROM), and a flash memory.

SUMMARY

Various embodiments of the present disclosure are directed to a memory system which can improve the reliability and lifetime of data in an environment in which an unstable input voltage is provided, and a method of operating the memory system.

An embodiment of the present disclosure may provide for a memory system. The memory system may include a memory device including a plurality of memory blocks, the memory device being configured to output voltage information indicating whether an unstable state of an input voltage has occurred, the input voltage being provided to the memory device from an external power source, and a memory controller configured to store a read count indicating a number of times that one or more read operations are performed on each of the plurality of memory blocks and to control the memory device to move data stored in a first memory block for which the read count exceeds a threshold count to second memory block, and configured to adjust the threshold count based on the voltage information.

An embodiment of the present disclosure may provide for a memory system. The memory system may include a memory device including a plurality of memory blocks, the memory device being configured to output voltage information indicating whether an unstable state of an input voltage has occurred, the input voltage being provided to the memory device from an external power source, and a memory controller configured to receive read data from the memory device, the read data being obtained through a read operation of reading pages included in a first memory block selected from among the plurality of memory blocks using one or more read voltages generated through the input voltage, when an error correction decoding operation of correcting error bits included in the read data has failed, control the memory device to perform a plurality of recovery read operations of reading the pages included in the first memory block while changing the read voltages until the error correction decoding operation passes, and when a number of times that the plurality of recovery read operations are performed exceeds a reference count, control the memory device to move data stored in the first memory block to a second memory block, wherein the memory controller adjusts the reference count based on the voltage information.

BRIEF DESCRIPTION OF THE DRAWINGS

FIG. 7 is a flowchart illustrating an operation method according to an embodiment of the present disclosure.

FIG. 8 is a diagram illustrating a threshold count table according to an embodiment of the present disclosure.

FIG. 9 is a diagram illustrating a read count according to an embodiment of the present disclosure.

DETAILED DESCRIPTION

Specific structural or functional descriptions in the embodiments of the present disclosure introduced in this specification or application are exemplified to describe embodiments according to the concept of the present disclosure. Such embodiments according to the concept of the present disclosure may be practiced in various forms, and should not be construed as being limited to the embodiments described in the specification or application.

Figure 1:
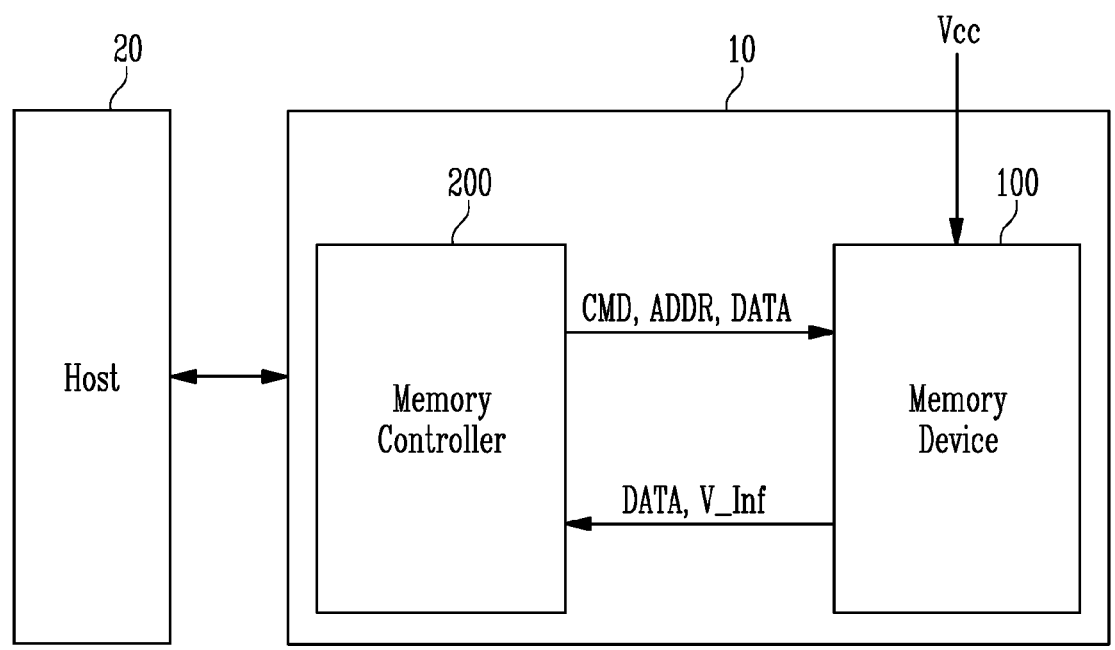
FIG. 1 is a diagram illustrating a memory system according to an embodiment of the present disclosure.

FIG. 1 is a diagram illustrating a memory system according to an embodiment of the present disclosure.

Referring to FIG. 1, a memory system 10 according to an embodiment of the present disclosure and a host 20 may communicate with each other.

The memory system 10 may be a semiconductor-based storage device. The memory system 10 may store data under the control of the host 20. The memory system 10 may provide the stored data to the host 20 under the control of the host 20.

The memory system 10 may be manufactured in any one of various types of package forms. For example, the memory system 10 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory system 10 may be implemented in one of various types of storage devices. For example, the memory system 10 may be implemented in any one of various types of storage devices, such as a solid state disk (SSD), a multimedia card (MMC), an embedded MMC (eMMC), reduced-size MMC (RS-MMC), micro-MMC, a secure digital (SD) card, a mini-SD card, a micro-SD card, a universal serial bus (USB)-type storage device, universal flash storage (UFS), personal computer memory card international association (PCMCIA), peripheral component interconnection (PCI), PCI express (PCI-E), a compact flash (CF) card, a smart media (SM) card, and a memory stick.

The host 20 may control the memory system 10. For example, the host 20 may provide a command instructing a program operation to be performed and data to the memory system 10. In response to the command, the memory system 10 may store the data in the memory device 100. In an example, the host 20 may provide a command that requests stored data to the memory system 10. In response to the command, the memory system 10 may provide the data, stored in the memory device 100, to the host 20. In an example, the host 20 may provide a command to the memory system 10 for instructing the memory system 10 to delete stored data therein. In response to the command, the memory system 10 may delete the data stored in the memory device 100.

The host 20 may be one of various electronic devices, such as a mobile phone, a smartphone, an MP3 player, a laptop computer, a desktop computer, a game console, a television (TV), a tablet PC, an in-vehicle infotainment system, and a wearable device. The memory system 10 may be implemented as a device separate from the host 20, or in a form in which the memory system 10 is embedded in the host 20.

The host 20 may communicate with the memory system 10 using at least one of various communication methods such as universal serial bus (USB), Serial AT Attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

The memory system 10 may include one or more memory devices 100 and a memory controller 200. The number of memory devices 100 may be one or more. Hereinafter, for convenience of description, a description will be made based on any one of the one or more memory devices 100.

The memory device 100 may include a plurality of memory blocks. Each of the memory blocks may include a plurality of pages. That is, one memory block may include a plurality of pages. Here, a page may be a unit on which a program operation of storing data is performed. Further, the page may be a unit on which a read operation of reading stored data is performed. A memory block may be a unit on which an erase operation of erasing stored data is performed. Each of the plurality of pages may include a plurality of memory cells. Each of the plurality of memory cells may store charge, and may have the state of a threshold voltage distribution corresponding to the amount of charge stored in the cell. Here, the state of the threshold voltage distribution may indicate data DATA.

The memory device 100 may use an input voltage Vcc, provided from an external power source, as an operating voltage. That is, the memory device 100 may perform an operation using the input voltage Vcc provided from the external power source. For example, the external power source may be the host 20 or a separate external device. The memory device 100 may generate internal voltages corresponding to various operations using the input voltage Vcc. The memory device 100 may perform corresponding operations using the internal voltages. For example, the operations may include one of a program operation of storing data DATA, a read operation of outputting stored data DATA, and an erase operation of deleting the stored data DATA. The internal voltages may include one of a program voltage, a read voltage, a pass voltage, and an erase voltage.

The memory device 100 may output data DATA stored in a memory block selected from among the plurality of memory blocks using the input voltage Vcc provided from the external power source. Here, the selected memory block may be a memory block selected by an address ADDR.

The memory device 100 may be operated under the control of the memory controller 200. When a command CMD is received from the memory controller 200, the memory device 100 may perform an operation corresponding to the command CMD. Here, the command CMD may include any one of a command instructing a program operation to be performed, a command instructing a read operation to be performed, and a command instructing an erase operation to be performed. Here, respective commands may have different identifiers depending on the operations to be instructed.

In an embodiment, the memory device 100 may be implemented as one of a NAND flash memory, a vertical NAND flash memory, a NOR flash memory, a static random access memory (static RAM; SRAM), a dynamic RAM (DRAM), a synchronous dynamic RAM (SDRAM), a double data rate (DDR) SDRAM, a low power DDR (LPDDR) SDRAM, a graphics DRAM (GDRAM), a Rambus DRAM (RDRAM), a Ferro-electric RAM (FeRAM), a magnetoresistive RAM (MRAM), a phase-change memory (PCM), a spin transfer torque magnetoresistive RAM (STT-RAM), and a resistive RAM (ReRAM). In the present specification, for convenience of description, a description is made on the assumption that the memory device 100 is a NAND flash memory.

The memory controller 200 may control the overall operation of the memory system 10.

When power is applied to the memory system 10, the memory controller 200 may run firmware (FW). The firmware (FW) may include a host interface layer (HIL) which controls communication with the host 20, a flash translation layer (FTL) which controls communication between the host 20 and the memory device 100, and a flash interface layer (FIL) which controls communication with the memory device 100. The memory controller 200 may be located outside of the memory device 100. The memory controller 200 may be coupled to the memory device 100 through a channel.

The memory controller 200 may control the memory device 100. In an embodiment, the memory controller 200 may control the memory device 100 in response to a request received from the host 20. In an embodiment, the memory controller 200 may autonomously control the memory device 100 regardless of a request received from the host 20.

The memory controller 200 may control the memory device 100 to perform various operations including a program operation, a read operation, and an erase operation.

In the case of the program operation, the memory controller 200 may provide a first command instructing the program operation to be performed among commands CMD, an address ADDR, and data DATA to the memory device 100. In response to the first command, the memory device 100 may store the data DATA by applying a program voltage to the page selected by the address ADDR.

In the case of the read operation, the memory controller 200 may provide a second command instructing the read operation to be performed, among the commands CMD, and an address ADDR to the memory device 100. In response to the second command, the memory device 100 may provide data DATA stored in a page, selected by the address ADDR, to the memory controller 200 or the host 20 by applying a read voltage to the selected page.

In the case of the erase operation, the memory controller 200 may provide a third command instructing the erase operation to be performed, among the commands CMD, and an address ADDR to the memory device 100. In response to the third command, the memory device 100 may erase data DATA stored in a memory block selected by the address ADDR by applying an erase voltage to the selected memory block.

When the memory device 100 iteratively performs a program operation or a read operation in the state in which the input voltage Vcc is unstable, the case where valid data DATA cannot be read from the memory device 100 may occur. The unstable state of the input voltage Vcc may occur in various situations such as the case where a sudden change in ambient temperature occurs, the case where power from the external power source is unstable, the case where a high frequency occurs in surroundings, and the case where an external device is electrically connected or disconnected to or from the memory system 10 through ports for various communication methods, such as a USB port. In an embodiment, the memory device 100 may generate a signal V_Inf indicating whether the input voltage Vcc is in an unstable state and provide the signal V_Inf to the memory controller 200.

The memory system 10 according to an embodiment of the present disclosure may adjust the time at which a read reclaim operation of moving data DATA stored in a memory block to another memory block is to be performed by distinguishing the state in which the input voltage Vcc is stable from the state in which the input voltage Vcc is unstable and by then applying different threshold counts to respective states. For example, assuming that a read reclaim operation on a specific block is performed when a recovery read count exceeds a threshold count, the threshold count may be reduced when the input voltage Vcc is in an unstable state, thereby increasing the possibility of performing a read reclaim operation on the specific block. Accordingly, when the input voltage Vcc is unstable, the situation in which the data DATA stored in the memory device 100 is abnormally degraded to make it impossible to recover valid data may be substantially prevented from occurring. That is, the lifetime of the memory system 10 may be lengthened by improving the reliability of the data DATA.

Hereinafter, detailed embodiments of the present disclosure will be described with reference to the attached drawings.

Figure 2:
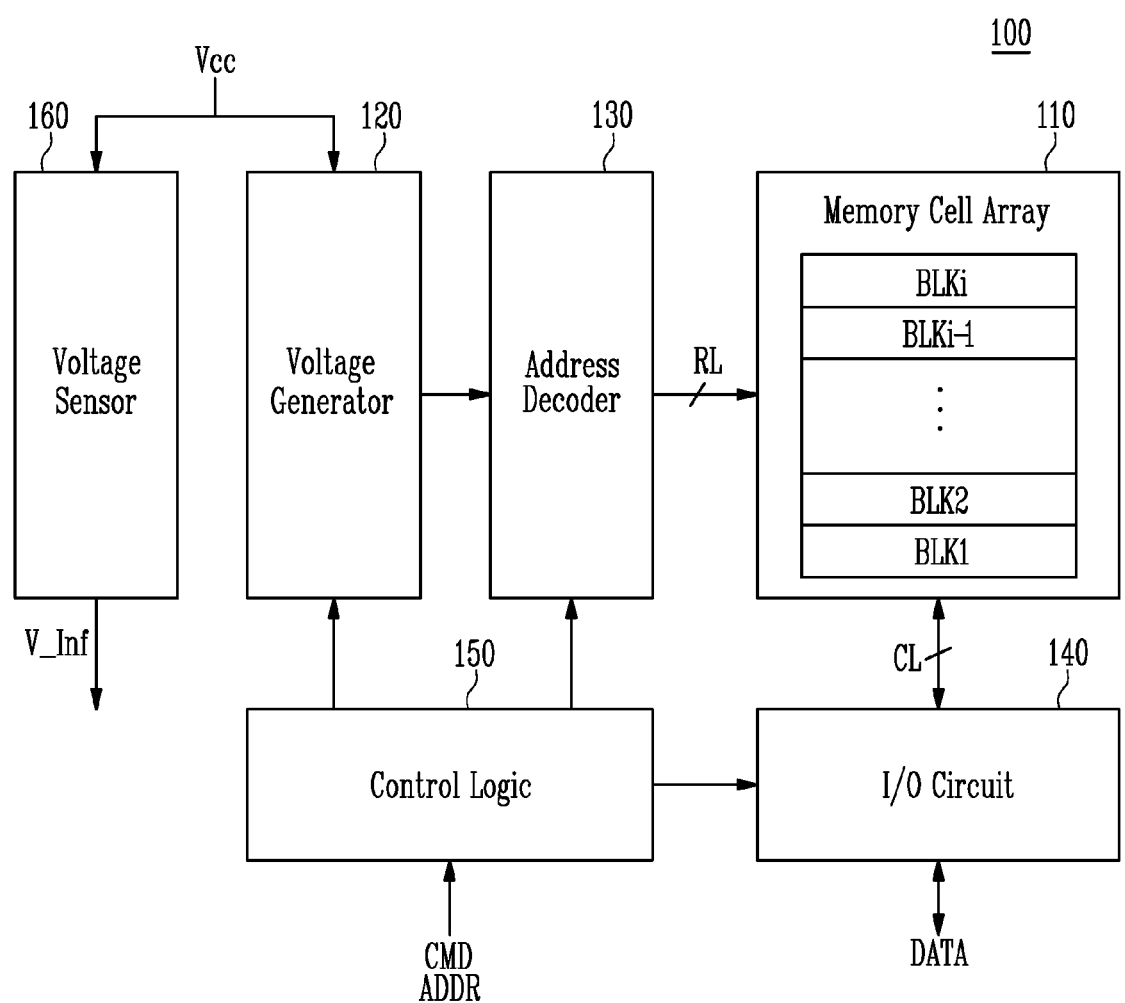
FIG. 2 is a diagram illustrating the structure of a memory device according to an embodiment of the present disclosure.

FIG. 2 is a diagram illustrating the structure of a memory device according to an embodiment of the present disclosure.

Referring to FIG. 2, the memory device 100 may include a memory cell array 110, a voltage generator 120, an address decoder 130, an input/output (I/O) circuit 140, and a control logic 150.

The memory cell array 110 may include a plurality of memory blocks BLK1 to BLKi. The plurality of memory blocks BLK1 to BLKi may be coupled to the address decoder 130 through row lines RL. The plurality of memory blocks BLK1 to BLKi may be coupled to the input/output (I/O) circuit 140 through column lines CL. In an embodiment, the row lines RL may include word lines, source select lines, and drain select lines. In an embodiment, the column lines CL may include bit lines.

Each of the memory blocks BLK1 to BLKi may include a plurality of memory cells.

In each of the plurality of memory cells, data may be stored. For example, each of the plurality of memory cells may store data having different numbers of bits depending on a scheme such as a single-level cell (SLC) capable of storing one bit, a multi-level cell (MLC) capable of storing two bits, a triple-level cell (TLC) capable of storing three bits, or a quad-level cell (QLC) capable of storing four bits. Memory cells coupled to the same word line, among the plurality of memory cells, may be defined as one page.

In an embodiment, each of the plurality of memory cells may be a nonvolatile memory cell. For example, each of the plurality of memory cells may include a floating gate in which charge can be accumulated. Each of the plurality of memory cells may indicate a specific value of data depending on the amount of charge accumulated in the floating gate.

In an embodiment, the voltage generator 120, the address decoder 130, and the I/O circuit 140 may be collectively designated as a peripheral circuit. The peripheral circuit may drive the memory cell array 110 under the control of the control logic 150. The peripheral circuit may drive the memory cell array 110 so as to perform a program operation, a read operation, and an erase operation.

The voltage generator 120 may generate a plurality of operating voltages using an external supply voltage provided to the memory device 100. The voltage generator 120 may be operated in response to the control of the control logic 150.

In an embodiment, the voltage generator 120 may generate an internal supply voltage by regulating the external supply voltage. The internal supply voltage generated by the voltage generator 120 may be used as an operating voltage for the memory device 100.

In an embodiment, the voltage generator 120 may generate one or more operating voltages using the input voltage Vcc provided from an external power source. The voltage generator 120 may generate various voltages required by the memory device 100. For example, the voltage generator 120 may generate a plurality of erase voltages, a plurality of program voltages, a plurality of read voltages, and a plurality of pass voltages. For this, the voltage generator 120 may include a plurality of pumping capacitors which receive the internal supply voltage. The voltage generator 120 may generate the plurality of operating voltages by selectively enabling the plurality of pumping capacitors in response to the control of the control logic 150.

The plurality of operating voltages generated by the voltage generator 120 may be supplied to the memory cell array 110 by the address decoder 130.

The address decoder 130 may be coupled to the memory cell array 110 through the row lines RL. The address decoder 130 may be operated in response to the control of the control logic 150. The address decoder 130 may receive addresses ADDR from the control logic 150. The address decoder 130 may decode a block address, among the received addresses ADDR. The address decoder 130 may select at least one of the memory blocks BLK1 to BLKi according to the decoded block address. The address decoder 130 may decode a row address, among the received addresses ADDR. The address decoder 130 may select at least one of word lines of the selected memory block according to the decoded row address. In an embodiment, the address decoder 130 may decode a column address, among the received addresses ADDR. The address decoder 130 may couple the I/O circuit 140 to the memory cell array 110 according to the decoded column address.

In an embodiment, the address decoder 130 may include components such as a row decoder, a column decoder, and an address buffer.

The I/O circuit 140 may include a plurality of page buffers. The plurality of page buffers may be coupled to the memory cell array 110 through the bit lines. During a program operation, data stored in the plurality of page buffers may be provided to a selected page through the bit lines, and the provided data may be stored in memory cells included in the selected page. During a read operation, the data stored in the memory cells included in the selected page may be sensed through the bit lines, and the sensed data may be stored in the page buffers.

The control logic 150 may control the address decoder 130, the voltage generator 120, and the I/O circuit 140. The control logic 150 may be operated in response to a command CMD transferred from an external device. The control circuit 150 may control the peripheral circuit by generating control signals in response to the command CMD and the addresses ADDR.

In an embodiment, the memory device 100 may include a voltage sensor 160.

In an embodiment, the voltage sensor 160 may output voltage information V_Inf indicating whether the input voltage Vcc supplied from the external power source is in an unstable state. For example, the voltage sensor 160 may output voltage information V_Inf indicating whether an event in which the level of the input voltage Vcc supplied from the external power source drops to a reference level or less has occurred. The detailed description thereof will be made later with reference to FIG. 4.

Figure 3:
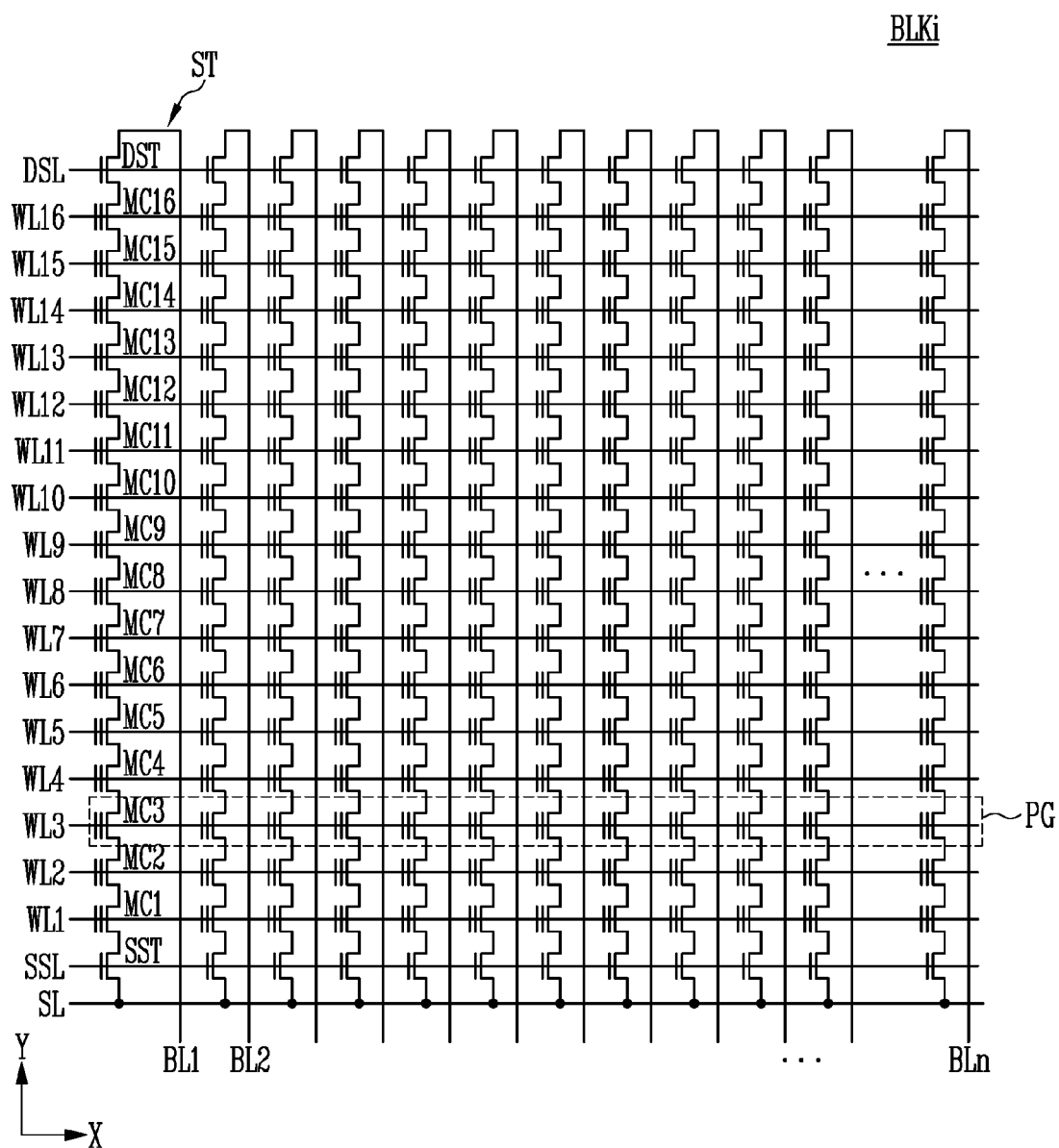
FIG. 3 is a diagram illustrating the structure of a memory block according to an embodiment of the present disclosure.

FIG. 3 is a diagram illustrating the structure of a memory block according to an embodiment of the present disclosure.

Referring to FIG. 3, the memory block BLKi may include a plurality of strings coupled between bit lines BL1 to BLn and a source line SL. The description of the memory block BLKi may be applied to each of the plurality of memory blocks BLK1 to BLKi.

The plurality of strings may be coupled to respective bit lines BL1 to BLn in one to one correspondence. The plurality of strings may be coupled in common to the source line SL. Since the plurality of strings may be equally configured, a string ST coupled to the first bit line BL1, among the plurality of strings, is described in detail by way of example. The description of the string ST may be equally applied to other strings.

The string ST may include a source select transistor SST, a plurality of memory cells MC1 to MC16, and a drain select transistor DST which are coupled in series to each other between the source line SL and the first bit line BL1.

The memory cells MC1 to MC16 may be coupled in series between the source select transistor SST and the drain select transistor DST. Gates of the memory cells MC1 to MC16 may be respectively coupled to a plurality of word lines WL1 to WL16 in one-to-one correspondence. The number of memory cells MC1 to MC16 included in one string ST may be greater than or less than that illustrated in the drawing.

A drain of the drain select transistor DST may be coupled to the first bit line BL1. A gate of the drain select transistor DST may be coupled to a drain select line DSL. A source of the source select transistor SST may be coupled to the source line SL. A gate of the source select transistor SST may be coupled to a source select line SSL. Each of the number of source select transistors SST included in one string ST and the number of drain select transistors DST included in one string ST may be one or more.

The plurality of word lines WL1 to WL16, the source select line SSL, and the drain select line DSL may be arranged in parallel to each other. The plurality of word lines WL1 to WL16, the source select line SSL, and the drain select line DSL may be arranged in a direction perpendicular to a direction in which the strings ST are arranged.

The memory block BLKi may include a plurality of pages. Each page may indicate a group of memory cells coupled to the same word line. In this case, the memory block BLki may include a number of pages identical to the number of the word lines WL1 to WL16. Since the plurality of pages may be equally configured, a page PG coupled to the third word line WL3, among the plurality of pages, is described in detail by way of example. The description of the page PG may be equally applied to other pages.

The page PG may include memory cells coupled to the third word line WL3, among the plurality of memory cells included in the memory block BLKi. The memory cells included in the page PG may be respective memory cells included in different strings.

In the case of a program operation, the memory device 100 may store data in the page PG by applying a program voltage to the page PG. In detail, the memory device 100 may apply the program voltage to the third word line WL3. In this case, the program voltage applied to the third word line WL3 may be transferred to respective gates of memory cells included in the page PG coupled to the third word line WL3. When the program voltage is applied to the gate of each of the memory cells included in the page PG, charge may be injected into the floating gate of each of the memory cells included in the page PG through a tunneling phenomenon. The threshold voltage of each memory cell may be changed with the amount of charge accumulated in the corresponding floating gate. Here, the threshold voltage may indicate a voltage applied to the gate when a channel through which current can flow between the source and the drain of the corresponding memory cell is formed.

Here, the program operation may be performed using an incremental step pulse programming (ISPP) method. The ISPP method may include a plurality of program loops. Each of the plurality of program loops may include a program (PGM) pulse step of applying a program voltage having a predefined level to a word line and a verify step of identifying whether the corresponding program loop has passed or failed by applying a verify voltage having a predefined level to the word line.

In the case of a read operation, the memory device 100 may output data stored in a selected page PG by applying a read voltage to the selected page PG and by applying a pass voltage to the remaining pages other than the selected page PG, that is, unselected pages. Here, the read voltage may be a voltage having a preset level depending on a scheme, such as a single-level cell, a multi-level cell, a triple-level cell, or a quad-level cell. The pass voltage may be a high-level voltage that is designated to form a channel through which current can flow into all memory cells included in the unselected pages.

In detail, the memory device 100 may apply the read voltage to the selected page PG through the third word line WL3 coupled to the selected page PG. The memory device 100 may apply the pass voltage to the unselected pages through word lines coupled to the unselected pages. The read voltage may be transferred to the gate of each of the memory cells included in the selected page PG. The channel through which current can flow may be formed in a memory cell, having a threshold voltage less than the read voltage applied to the gate thereof, among the plurality of memory cells included in the selected page PG. Unlike this, a channel may not be formed in a memory cell, having a threshold voltage greater than the read voltage applied to the gate thereof, among the plurality of memory cells included in the selected page PG. The pass voltage may be transferred to the gate of each of the memory cells included in the unselected pages, and thus channels may be formed in respective memory cells included in the unselected pages. The memory device 100 may sense whether current flows through each of the strings. The memory device 100 may output read data as the result of sensing obtained by applying the read voltage having a specific level to the selected page PG. The read data may include a plurality of pieces of column data. Here, each piece of column data may indicate the result of sensing from a corresponding string.

Details of the read operation will be described with reference to FIGS. 6A and 6B.

Figure 4:
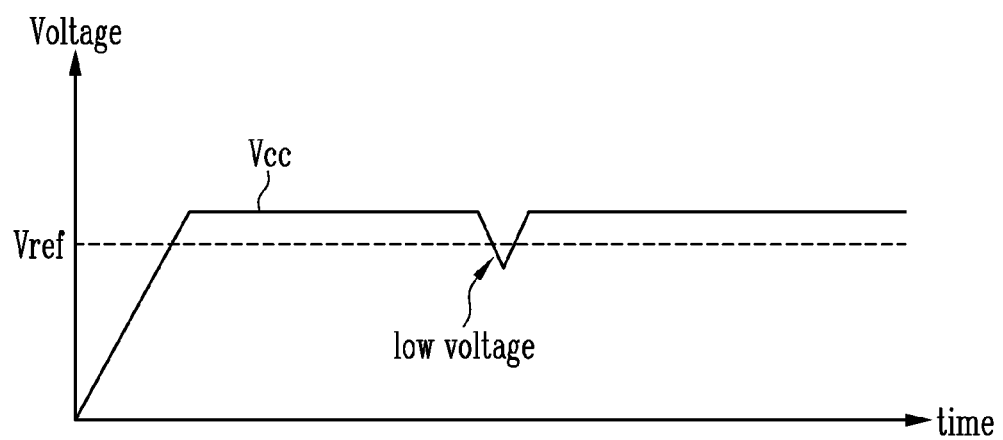
FIG. 4 is a diagram illustrating an input voltage according to an embodiment of the present disclosure.

FIG. 4 is a diagram illustrating an input voltage according to an embodiment of the present disclosure.

Referring to FIGS. 2 and 4, the voltage sensor 160 may periodically sense the level of an input voltage Vcc supplied from an external power source. The voltage sensor 160 may generate voltage information V_Inf indicating whether an event in which the level of the input voltage Vcc supplied from the external power source drops to a reference level Vref or less has occurred. Here, the reference level Vref may be a preset value. The voltage sensor 160 may output the generated voltage information V_Inf to the memory controller 200.

In an embodiment, when the level of the input voltage Vcc has risen to the reference level Vref or more and thereafter drops to the reference level Vref or less, the voltage sensor 160 may generate voltage information V_Inf, indicating that the event in which the level of the input voltage Vcc drops to the reference level Vref or less has occurred, and may output the generated voltage information V_Inf to the memory controller 200. For example, when the input voltage Vcc is kept substantially at a target level in a stable state, the reference level Vref may be equal to or less than 99%, 97%, 95%, or 90% of the target level of the input voltage Vcc. For example, the value of the generated voltage information V_Inf may be a first logic value (e.g. 1). The memory controller 200 may identify, based on the value of the voltage information V_Inf, that the event in which the level of the input voltage Vcc drops to the reference level Vref or less has occurred. In this case, the memory controller 200 may determine that the input voltage Vcc provided to the memory device 100 is unstable.

In an embodiment, when the level of the input voltage Vcc has risen to the reference level Vref or more and thereafter does not drop to the reference level Vref or less, the voltage sensor 160 may generate voltage information V_Inf, indicating that an event in which the level of the input voltage Vcc drops to the reference level Vref or less has not occurred, and may output the generated voltage information V_Inf to the memory controller 200. For example, the value of the generated voltage information V_Inf may be a second logic value (e.g., 0). The memory controller 200 may identify, based on the value of the voltage information V_Inf, that the event in which the level of the input voltage Vcc drops to the reference level Vref or less has not occurred. In this case, the memory controller 200 may determine that the input voltage Vcc provided to the memory device 100 is stable.

The voltage sensor 160 may output the voltage information V_Inf when the event in which the level of the input voltage Vcc drops to the reference level Vref or less occurs. Alternatively, the voltage sensor 160 may output the voltage information V_Inf at intervals of a preset time. Alternatively, when a command requesting the voltage information V_Inf is received from the memory controller 200, the voltage sensor 160 may output the voltage information V_Inf in response to the command.

In an embodiment, the event may be set to an event in which the level of the input voltage Vcc drops to a first reference level or less, or to an event in which the level of the input voltage Vcc rises to a second reference level or more. Here, the first reference level may be lower than the second reference level. In this case, the voltage sensor 160 may output voltage information V_Inf indicating whether the event in which the level of the input voltage Vcc drops to the first reference level or less or the event in which the level of the input voltage Vcc rises to the second reference level or more has occurred. That is, the voltage information V_Inf may indicate whether the level of the input voltage Vcc belongs to an interval between the first reference level and the second reference level. It may be determined that, when the level of the input voltage Vcc belongs to the interval between the first reference level and the second reference level, the input voltage Vcc is stable, and when the level of the input voltage Vcc does not belong to the corresponding interval, the input voltage Vcc is unstable. For example, the input voltage Vcc may be stable when the level of the input voltage Vcc lies within a given range from the first reference level to the second reference level, the first reference level being obtained by subtracting 0.5%, 1.5%, 2.5%, or 5% of a target level of the input voltage Vcc from the target level, and the second reference level being obtained by adding 0.5%, 1.5%, 2.5%, or 5% of the target level of the input voltage Vcc to the target level.

In an embodiment, the event may be set to an event in which the number of times that the level of the input voltage Vcc has dropped to the reference level or less exceeds the preset number of times. In this case, the voltage sensor 160 may output voltage information V_Inf indicating whether the event in which the number of times that the level of the input voltage Vcc has dropped to the reference level (or a first reference level) or less exceeds the preset number of times has occurred. In an embodiment, when the number of times that the level of the input voltage Vcc becomes equal to or less than the first reference level exceeds a preset number of times during a given time interval, the input voltage Vcc may be unstable. In an embodiment, when the number of times that the level of the input voltage Vcc becomes equal to or greater than a second reference level exceeds a preset number of times, the input voltage Vcc may be unstable. For example, the second reference level may be equal to or greater than 101%, 103%, 105%, or 110% of the target level of the input voltage Vcc. In an embodiment, when the number of times that the level of the input voltage Vcc lies outside a given range exceeds a preset number of times, the input voltage Vcc may be unstable. For example, the given range may be from a third reference level to a fourth reference level, the third reference level being obtained by subtracting 0.5%, 1.5%, 2.5%, or 5% of a target level of the input voltage Vcc from the target level, and the fourth reference level being obtained by adding 0.5%, 1.5%, 2.5%, or 5% of the target level of the input voltage Vcc to the target level.

Meanwhile, the memory device 100 may include a buffer (not illustrated). The buffer may temporarily store the voltage information V_Inf. The buffer may output the stored voltage information V_Inf. For this, the buffer may include at least one of volatile memories, such as DRAM, SDRAM, DDR SDRAM, LPDDR SDRAM, and GRAM, or nonvolatile memories, such as FRAM, ReRAM, STT-MRAM, and PRAM.

Figure 5:
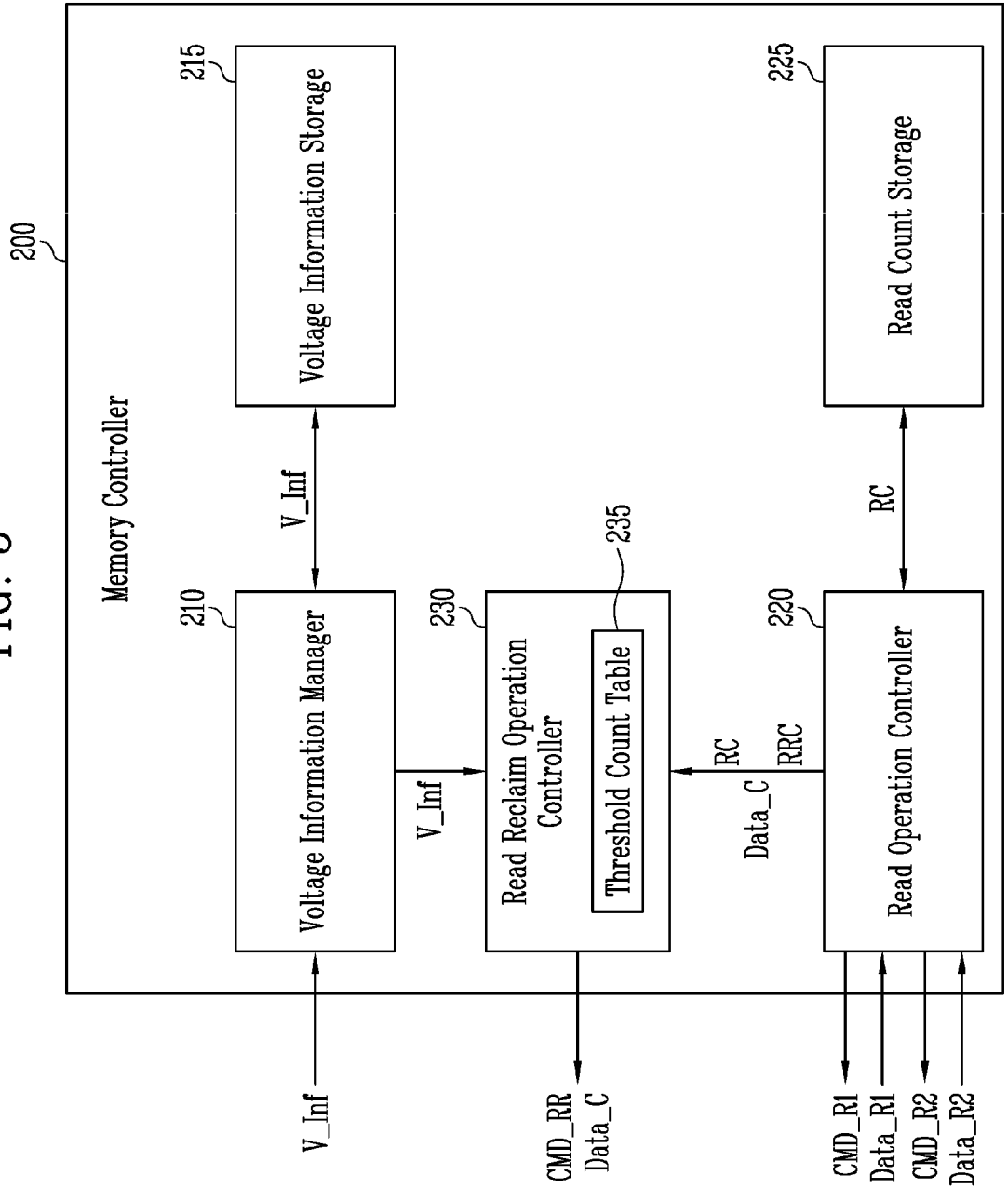
FIG. 5 is a diagram illustrating the structure of a memory controller according to an embodiment of the present disclosure.

FIG. 5 is a diagram illustrating the structure of a memory controller according to an embodiment of the present disclosure.

Referring to FIG. 5, the memory controller 200 may include a voltage information manager 210 and a voltage information storage 215.

The voltage information manager 210 may receive voltage information V_Inf from the memory device 100, and may store the received voltage information V_Inf in the voltage information storage 215.

In an embodiment, when voltage information V_Inf indicating that an event has occurred is not received from the memory device 100 for a reference time period from the time point at which the event occurred, the voltage information manager 210 may update the voltage information V_Inf stored in the voltage information storage 215 so as to indicate that the event has not occurred.

In an embodiment, when voltage information V_Inf indicating that an event has occurred is not received from the memory device 100 for the reference time period from any one time point, the voltage information manager 210 may update the voltage information V_Inf stored in the voltage information storage 215 so as to indicate that the event has not occurred. Any one time point may be an arbitrary time point irrelevant to the time point at which the event occurred.

The voltage information storage 215 may store the voltage information V_Inf. The voltage information storage 215 may transfer the stored voltage information V_Inf to the voltage information manager 210 or a read reclaim operation controller 230.

For this, the voltage information storage 215 may include at least one of volatile memories, such as DRAM, SDRAM, DDR SDRAM, LPDDR SDRAM, and GRAM, or nonvolatile memories, such as FRAM, ReRAM, STT-MRAM, and PRAM.

The memory controller 200 may include a read operation controller 220.

The read operation controller 220 may control the memory device 100 to perform a read operation of reading a page included in a memory block selected from among a plurality of memory blocks. That is, the read operation controller 220 may provide the memory device 100 with a read command CMD_R1 instructing the read operation of reading the page included in the selected memory block to be performed. In response to the command, the memory device 100 may perform the read operation of reading data stored in a selected page. The read operation may be an operation of reading the data stored in the selected page by applying a default read voltage to the selected page, among the pages included in the selected memory block, and by applying a pass voltage to an unselected page included in the selected memory block. The memory device 100 may output read data Data_R1 that is output through the read operation.

The read operation controller 220 may receive the read data Data_R1 that is output through the read operation from the memory device 100. The read operation controller 220 may perform an error correction decoding operation of correcting error bits contained in the received read data Data_R1.

In an embodiment, when the error correction decoding operation of correcting the error bits contained in the read data Data_R1 has passed, the read operation controller 220 may provide correction data Data_C, obtained by correcting the error bits contained in the read data Data_R1, to the host 20.

Meanwhile, in other embodiments, when the error correction decoding operation of correcting the error bits contained in the read data Data_R1 has failed, the read operation controller 220 may control the memory device 100 to perform a plurality of recovery read operations of reading pages included in the selected memory block while changing the read voltage until the error correction decoding operation passes. The order of the plurality of recovery read operations may be preset. The read operation controller 220 may transfer a recovery read count RRC, indicating the number of times that the plurality of recovery read operations are sequentially performed until the error correction decoding operation passes, to the read reclaim operation controller 230.

Such a recovery read operation may be an operation of changing a default read voltage depending on a specific algorithm and then acquiring read data using the changed read voltage. The recovery read operation may be performed when threshold voltage distributions of memory cells are changed to such an extent that it is difficult to distinguish the threshold voltage distributions of the memory cells from each other through the default read voltage.

In an embodiment, the plurality of recovery read operations may include a read retry operation, a history read operation, an optimal read voltage search operation, and a soft read operation. However, this is only an embodiment, and the plurality of recovery read operations may include recovery read operations corresponding to various algorithms.

For example, when the error correction decoding operation of correcting error bits contained in the read data Data_R1 has failed, the read operation controller 220 may provide the memory device 100 with a first recovery read command CMD_R2 instructing the first recovery read operation to be performed. The read operation controller 220 may receive read data Data_R2 that is acquired through the first recovery read operation from the memory device 100.

Also, the read operation controller 220 may perform an error correction decoding operation of correcting error bits contained in the read data Data_R2 acquired through the first recovery read operation. Here, when the error correction decoding operation of correcting the error bits contained in the read data Data_R2 has passed, the read operation controller 220 may provide correction data Data_C, obtained by correcting the error bits contained in the read data Data_R2, to the host 20.

Meanwhile, when the error correction decoding operation of correcting the error bits contained in the read data Data_R2 has failed, the read operation controller 220 may provide the memory device 100 with a second recovery read command instructing a second recovery read operation to be performed. The read operation controller 220 may receive read data, acquired through the second recovery read operation, from the memory device 100, and may perform an error correction decoding operation of correcting error bits contained in the read data, acquired through the second recovery read operation. Until the error correction decoding operation passes, the recovery read operations may be sequentially performed.

The memory controller 200 may include a read count storage 225.

The read count storage 225 may store a read count RC indicating the number of times that a read operation is performed on each of the plurality of memory blocks. For example, whenever the read operation controller 220 controls the memory device 100 to perform the read operation on any one memory block, the read operation controller 220 may update the read count RC for the corresponding memory block, and may store the read count RC in the read count storage 225. The read count storage 225 may output the stored read count RC.

For this, the read count storage 225 may include at least one of volatile memories, such as DRAM, SDRAM, DDR SDRAM, LPDDR SDRAM, and GRAM, or nonvolatile memories, such as FRAM, ReRAM, STT-MRAM, and PRAM.

The memory controller 200 may include the read reclaim operation controller 230.

The read reclaim operation controller 230 may adjust a threshold count. For example, the read reclaim operation controller 230 may set the threshold count to a first threshold count (or a first threshold value) or a second threshold count (or a second threshold value). Here, the threshold count may include one or both of a threshold count A and a threshold count B, which will be described later. The detailed description thereof will be made later with reference to FIG. 7.

In an embodiment, when the read count RC for a memory block selected from among the plurality of memory blocks exceeds the threshold count A, the read reclaim operation controller 230 may control the memory device 100 to move data, included in the selected memory block, to another memory block. Here, the data included in the selected memory block may include correction data Data_C obtained by correcting error bits contained in the read data.

In an embodiment, when the read count RC for the memory block selected from among the plurality of memory blocks exceeds the threshold count A, the read reclaim operation controller 230 may control the memory device 100 to move valid data, among pieces of data included in the selected memory block, to another memory block. That is, among the pieces of data included in the selected memory block, invalid data may not be moved to another memory block.

The valid data may indicate stored data when a logical address at which the data is stored can be identified. The invalid data may indicate stored data when a logical address at which the data is stored cannot be identified. For example, when a physical address is assigned to a logical address, the valid data may represent data stored in a page corresponding to the physical address in the memory device 100. When a new physical address is assigned after a physical address has been assigned to a logical address, the invalid data may represent data stored in a page corresponding to the previous physical address in the memory device 100.

In an embodiment, when the recovery read count RRC indicating the number of times that the plurality of recovery read operations are performed exceeds the threshold count B, the read reclaim operation controller 230 may control the memory device 100 to move data stored in the selected memory block including correction data Data_C, obtained by correcting error bits through the error correction decoding operation that has passed, to another memory block.

In an embodiment, when the recovery read count RRC indicating the number of times that a plurality of recovery read operations are performed exceeds the threshold count B, the read reclaim operation controller 230 may control the memory device 100 to move valid data, among pieces of data stored in pages included in the selected memory block, to another memory block. That is, among the pieces of data included in the selected memory block, invalid data may not be moved to another memory block.

Figure 6A:
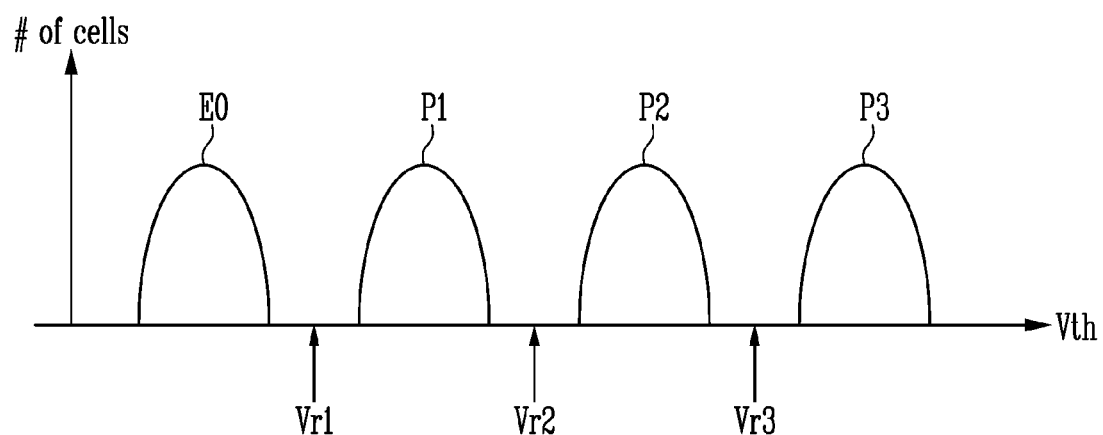
FIGS. 6A and 6B are diagrams illustrating threshold voltage distributions according to an embodiment of the present disclosure.
Figure 6B:
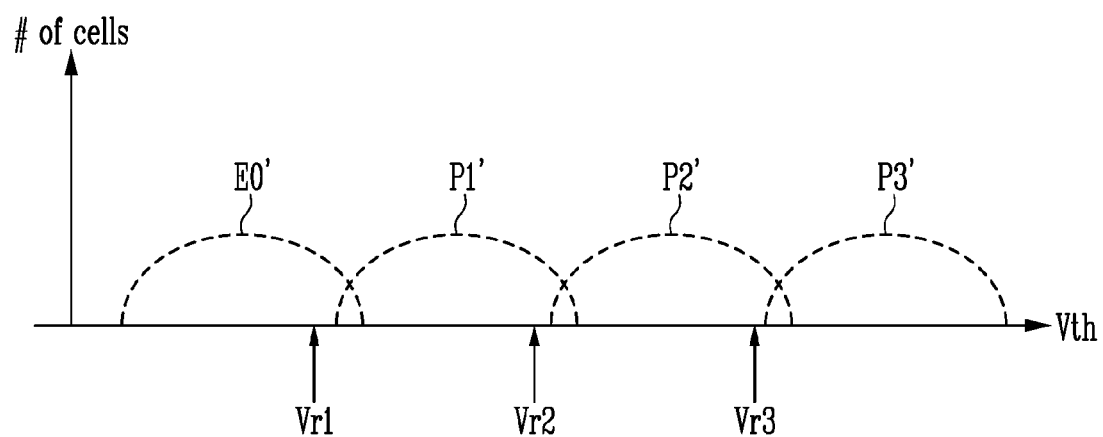

FIGS. 6A and 6B are diagrams illustrating threshold voltage (Vth) distributions according to an embodiment of the present disclosure.

With reference to FIG. 6A, a description will be made on the assumption that the memory device 100 performs a program operation on a page selected from among pages included in a memory block included in the memory device 100 based on a multi-level cell (MLC) scheme. In this case, memory cells included in the selected page may have threshold voltage distributions which are classified into an erased state E0 and respective program states P1 to P3.

Further, the memory device 100 may output read data which is read from the selected page by performing a read operation on the selected page. For example, the memory device 100 may output the read data by applying a first read voltage Vr1 to a third read voltage Vr3 that are generated using the input voltage Vcc to the selected page. Here, the first read voltage Vr1 to the third read voltage Vr3 may be designated to distinguish respective states, such as the erased state E0 and the program states P1 to P3, from each other, and may be read voltages set to defaults.

In a detailed example, the memory device 100 may apply the first read voltage Vr1 to the selected page, and may apply a pass voltage to unselected pages. In this case, a cell that is turned on with application of the first read voltage Vr1 may be identified as being in the erased state E0. The memory device 100 may apply the second read voltage Vr2 to the selected page, and may apply the pass voltage to the unselected pages. In this case, the remaining cells, other than the cell identified as being in the erased state E0, among cells that are turned on with application of the second read voltage Vr2, may be identified as being in the first program state P1.

The memory device 100 may apply the third read voltage Vr3 to the selected page, and may apply the pass voltage to the unselected pages. In this case, the remaining cells, other than the cells identified as being in the erased state E0 and the first program state P1, among cells that are turned on with application of the third read voltage Vr3, may be identified as being in the second program state P2. Further, cells that are not turned on may be identified as being in the third program state P3. The erased state E0 and respective program states P1 to P3 may indicate data having a specific number of bits. For example, data may be 11, 10, 01, 00, etc.

Referring to FIGS. 6A and 6B, the threshold voltage distributions of memory cells such as those illustrated in FIG. 6A may be degraded as in an erased state E0' and respective program states P1' to P3', as illustrated in FIG. 6B. Here, the erased state E0' and the program states P1' to P3' may partially overlap each other.

In particular, when a program operation or a read operation is performed using an operating voltage generated based on an unstable input voltage Vcc, degradation of threshold voltages may be accelerated. In this state, when the selected page is read using the read voltages Vr1 to Vr3 that are set to defaults, the number of error bits contained in the read data may be increased depending on the degraded threshold voltages of the memory cells. Here, error bits may indicate bits in which loss of data or change in data has occurred. When the number of error bits becomes equal to or greater than a correctable limit, it may be impossible to correct the error bits.

In order to address the above-described issues, the memory controller 200 may perform a read reclaim operation of moving data stored in a memory block to another memory block at the time point at which valid data can be read. Because the read reclaim operation may deteriorate the performance of the memory device 100 by causing an overhead during a procedure for performing the read reclaim operation, optimization of performance of the read reclaim operation may be desirable.

In accordance with an embodiment of the present disclosure, the memory controller 200 may adjust a threshold count functioning as a trigger for performing a read reclaim operation.

In detail, the memory controller 200 may adjust the threshold count based on the voltage information V_Inf. The memory controller 200 may identify, based on the value of the voltage information V_Inf, whether an event in which the level of the input voltage Vcc drops to the reference level Vref or less has occurred. When the event in which the level of the input voltage Vcc drops to the reference level Vref or less has occurred, the input voltage Vcc may be defined as being unstable, whereas when the event in which the level of the input voltage Vcc drops to the reference level Vref or less has not occurred, the input voltage Vcc may be defined as being stable. Here, the threshold count is the value used to be compared with the number of times that a read operation is performed or the number of times that a recovery read operation is performed. That is, the memory controller 200 may adjust the threshold count depending on whether the input voltage Vcc is stable or unstable.

In an embodiment, the memory controller 200 may store a read count indicating the number of times that the read operation is performed on each of the plurality of memory blocks.

The memory controller 200 may acquire the read count using various schemes. For example, the memory controller 200 may acquire the number of times that a control command is transmitted to each of the plurality of memory blocks included in the memory device 100 so as to perform the read operation on each of the memory blocks, as the read count for the corresponding memory block. In an example, the memory controller 200 may receive the read count for each of the plurality of memory blocks from the memory device 100, thus acquiring the read count.

The memory controller 200 may control the memory device 100 to move the data, stored in a memory block for which the read count exceeds a threshold count, to another memory block. Here, the term "move" indicates that data stored in the corresponding memory block is copied to another memory block, after which the data stored in the corresponding memory block is deleted. That is, the memory controller 200 may control the memory device 100 to perform a program operation of storing data, stored in the memory block for which the read count exceeds the threshold count, in another memory block, and perform an erase operation of deleting the data stored in the memory block for which the read count exceeds the threshold count.

In an embodiment, the memory controller 200 may provide the memory device 100 with a read command instructing a read operation of reading a page included in the selected memory block to be performed based on the read voltages Vr1, Vr2, and Vr3 that are generated using the input voltage Vcc. In the page included in the selected memory block, data including a parity bit may be stored. That is, the data stored in the memory device 100 may include actual data and the parity bit. Here, the parity bit may indicate an identifier used to detect errors, that is, error bits, in data. For example, the parity bit may be inserted into the location corresponding to a start portion or an end portion of data bits in the actual data. In an example, the parity bit may be inserted into locations corresponding to the power of 2, such as 1, 2, 4, 8, 16, . . . , and data bits in the actual data may be arranged at the remaining locations. The memory controller 200 may receive read data that is read through the read operation from the memory device 100.

The memory controller 200 may perform an error correction decoding operation of correcting the error bits contained in the read data.

In detail, the memory controller 200 may detect error bits contained in the read data using the parity bit contained in the read data. For example, the memory controller 200 may detect the error bits contained in the read data using various schemes, such as a parity check, a block sum check, and a cyclic redundancy check (CRC).

When the number of error bits is less than or equal to the correctable limit, the memory controller 200 may identify that the error correction decoding operation has passed. When the error correction decoding operation has passed, the memory controller 200 may correct the error bits contained in the read data. Meanwhile, when the number of error bits is greater than the correctable limit, the memory controller 200 may identify that the error correction decoding operation has failed. In this case, when the error correction decoding operation has failed, the memory controller 200 cannot correct the error bits contained in the read data.

Further, when the error correction decoding operation of correcting error bits contained in the read data has failed, the memory controller 200 may perform one or more recovery read operations of reading respective pages included in the selected memory block while changing the read voltage Vr1, Vr2, or Vr3 until the error correction decoding operation passes.

The memory controller 200 may control the memory device 100 to move the data stored in the selected memory block to another memory block when the number of times that the plurality of recovery read operations are performed exceeds the threshold count. Because the detailed configuration of the memory controller 200 has been described above with reference to FIG. 5, repeated descriptions thereof may be omitted for the interest of brevity.

FIG. 7 is a flowchart illustrating an operation method according to an embodiment of the present disclosure.

Referring to FIG. 7, the read reclaim operation controller 230 may adjust a threshold count based on voltage information V_Inf at step S710. In an embodiment, the read reclaim operation controller 230 may set the threshold count to a first threshold value. The read reclaim operation controller 230 may change the threshold count to a second threshold value, lower than the first threshold value, in response to voltage information V_Inf indicating that an event has occurred.

In an embodiment, the read reclaim operation controller 230 may adjust the threshold count using the threshold count table 235. This will be described below with reference to FIG. 8.

FIG. 8 is a diagram illustrating a threshold count table according to an embodiment of the present disclosure.

Referring to FIGS. 5 and 8, the read reclaim operation controller 230 may store the threshold count table 235.

In an embodiment, the threshold count table 235 may include a first threshold count (or a first threshold value) THA_1 for threshold count A, mapped to the value (e.g., 0) of the voltage information V_Inf indicating that the event has not occurred, and a second threshold count (or a second threshold value) THA_2 for threshold count A, mapped to the value (e.g., 1) of the voltage information V_Inf indicating that the event has occurred. Here, threshold count A may have the value to be compared with that of a read count RC indicating the number of times that a read operation is performed on each memory block. The second threshold count THA_2 may be a value lower than that of the first threshold count THA_1. For example, the first threshold count THA_1 may have a value corresponding to hundred thousand times, and the second threshold count THA_2 may have a value corresponding to thirty thousand times.

In an embodiment, the threshold count table 235 may include a first threshold count (or a first threshold value) THB_1 for threshold count B, mapped to the value (e.g., 0) of the voltage information V_Inf indicating that the event has not occurred, and a second threshold count (or a second threshold value) THB_2 for threshold count B, mapped to the value (e.g., 1) of the voltage information V_Inf indicating that the event has occurred. Here, the threshold count B may have the value to be compared with that of a recovery read count RRC indicating the number of times that different recovery read operations are performed when the error correction decoding operation fails. The second threshold count THB_2 may be a value lower than that of the first threshold count THB_1. In an embodiment, the first threshold count THB_1 may be a multiple of the second threshold count THB_2. For example, the first threshold count THB_1 may have a value corresponding to ten times, and the second threshold count THB_2 may have a value corresponding to five times. In an embodiment, the second threshold count THB_2 of the threshold count B may be sufficiently small to substantially prevent an occurrence of impossible recovery of valid data and sufficiently large to reduce overhead for performing an excessively large number of read reclaim operations. For example, the second threshold count THB_2 of the threshold count B may be in a range from 2 to 5. Threshold count B may be referred to as a 'reference count' so as to be distinguished from threshold count A.

The read reclaim operation controller 230 may adjust the threshold count based on the threshold count table 235. For example, the read reclaim operation controller 230 may adjust the threshold count to a specific threshold count (or a specific value) corresponding to the value of the voltage information V_Inf stored in the voltage information storage 215, among the first threshold counts and the second threshold counts included in the threshold count table 235.

In a detailed example, when the voltage information V_Inf has a first value (e.g., 0), the read reclaim operation controller 230 may apply a normal recovery mode. The normal recovery mode may be a mode in which the first threshold count THA_1 is applied to threshold count A and the first threshold count THB_1 is applied to threshold count B. For example, when the voltage information V_Inf has a value of 0, the threshold count A may have the first threshold value THA_1 and the threshold count B may have the first threshold count THB_1 in the normal recovery mode.

Meanwhile, when the voltage information V_Inf has a second value (e.g., 1), the read reclaim operation controller 230 may apply a quick recovery mode. The quick recovery mode may be a mode in which the second threshold count THA_2 is applied to threshold count A and the second threshold count THB_2 is applied to threshold count B. For example, when the voltage information V_Inf has a value of 1, the threshold count A may have the second threshold value THA_2 and the second threshold count B may have the second threshold count THB_2 in the quick recovery mode.

Referring back to FIG. 7, the read reclaim operation controller 230 may identify a memory block for which the read count RC is greater than threshold count A at step S720. For example, at step S720, the read reclaim operation controller 230 may identify one or more memory blocks, each of which has a value of the read count RC that is greater than a value of the threshold count A, the value of the threshold count A being the first threshold value THA_1 in the normal recover mode or the second threshold value THA_2 in the quick recovery mode.

In detail, the read reclaim operation controller 230 may compare the read count RC for each of the plurality of memory blocks, stored in the read count storage 225, with threshold count A. The read count RC will be described in detail below with reference to FIG. 9.

FIG. 9 is a diagram illustrating a read count according to an embodiment of the present disclosure.

Referring to FIG. 9, the read count storage 225 may store read counts RC aggregated for respective memory blocks. For example, the read count storage 225 may store a first read count RC1 for a first memory block Blk1, a second read count RC2 for a second memory block Blk2, a third read count RC3 for a third memory block Blk3, a fourth read count RC4 for a fourth memory block Blk4, and so on.

Each read count RC may indicate the number of times that a read operation of reading pages included in the corresponding memory block is performed. For example, assuming that a read operation is performed once on a first page included in the first memory block Blk1 and a read operation is performed once on a second page included in the first memory block Blk1, the first read count RC1 for the first memory block Blk1 may be 2.

Referring back to FIG. 7, the read count storage 225 may compare the read count RC for each of the plurality of memory blocks stored in the read count storage 225 with the adjusted threshold count A. When a memory block for which the read count RC exceeds threshold count A is present (in the case of Yes at step S720), the read count storage 225 may select the memory block for which the read count RC exceeds threshold count A. Meanwhile, when a memory block for which the read count RC exceeds threshold count A is not present (in the case of No at step S720), the read count storage 225 may terminate the process without performing a read reclaim operation.

The read reclaim operation controller 230 may control the memory device 100 to move data stored in the selected memory block to another memory block at step S730. That is, the read reclaim operation controller 230 may control the memory device 100 to perform a read reclaim operation on the memory block for which the read count RC exceeds threshold count A.

Figure 10:
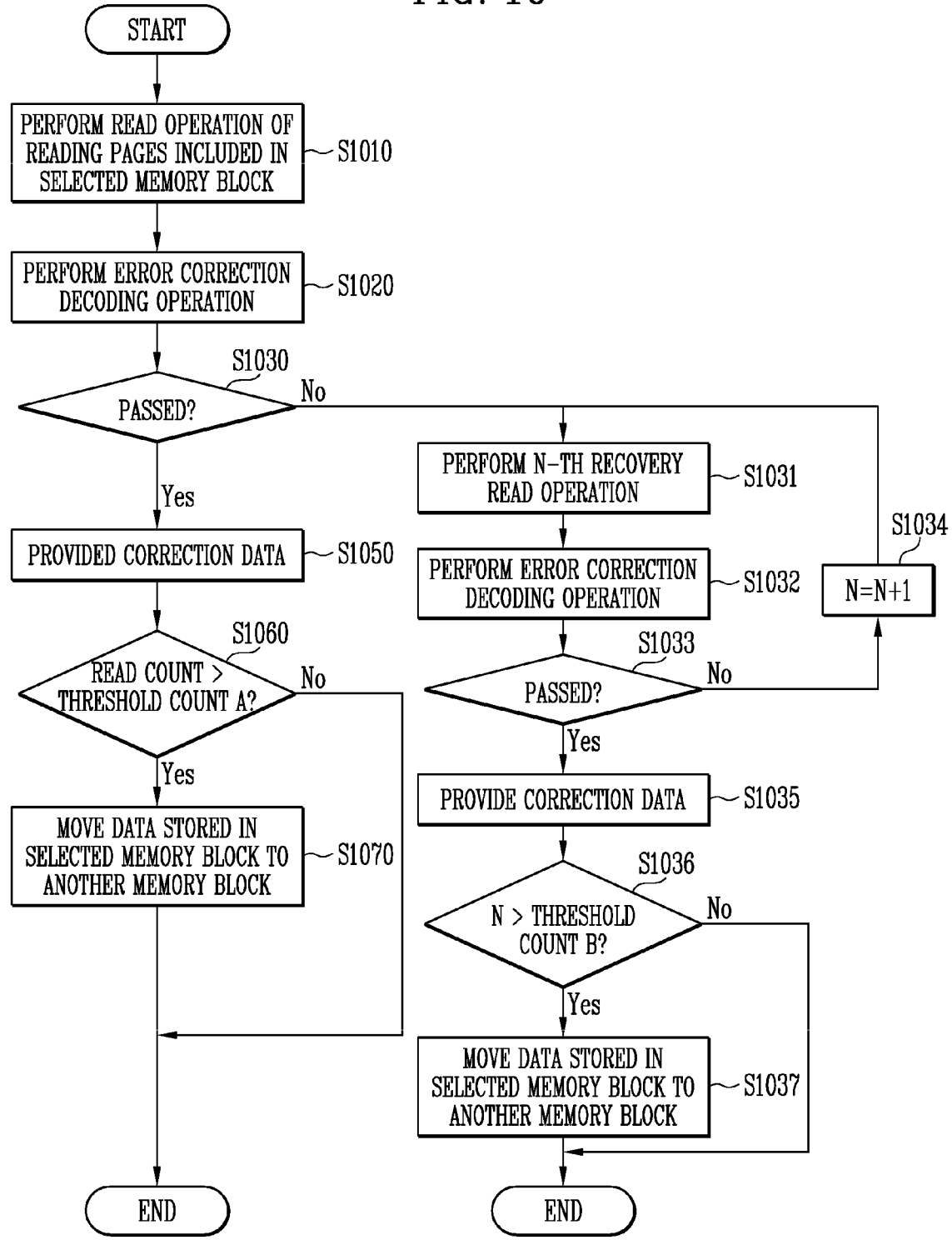
FIG. 10 is a flowchart illustrating an operation method according to an embodiment of the present disclosure.

FIG. 10 is a flowchart illustrating an operation method according to an embodiment of the present disclosure.

Referring to FIG. 10, at step S1010, the memory controller 200 may control the memory device 100 to perform a read operation of reading pages included in a selected memory block. The memory controller 200 may receive read data that is read through the read operation from the memory device 100.

The memory controller 200 may perform an error correction decoding operation of correcting error bits contained in the read data at step S1020.

In an embodiment, when the error correction decoding operation of correcting the error bits contained in the read data has passed (in the case of Yes at step S1030), the memory controller 200 may provide correction data Data_C, obtained by correcting the error bits contained in read data Data_R1, to the host 20 at step S1050.

Meanwhile, the memory controller 200 may periodically check voltage information V_Inf, and may adjust the threshold count based on the voltage information V_Inf. When the voltage information V_Inf has a value of 0 indicating that an event in which the level of the input voltage Vcc drops to the reference level Vref or less has not occurred, the memory controller 200 may apply the first threshold count THA_1 to threshold count A, and may apply the first threshold count THB_1 to threshold count B. Meanwhile, when the voltage information V_Inf has a value of 1 indicating that the event in which the level of the input voltage Vcc drops to the reference level Vref or less has occurred, the memory controller 200 may apply the second threshold count THA_2, lower than the first threshold count THA_1, to threshold count A, and may apply the second threshold count THB_2, lower than the first threshold count THB_1, to the threshold count B. That is, the operation of adjusting the threshold counts may be periodically performed, and may be performed regardless of the order in which the operations illustrated in FIG. 10 are performed.

When a memory block for which the read count RC exceeds threshold count A is present (in the case of Yes at step S1060), the memory controller 200 may select the memory block for which the read count RC exceeds threshold count A. In contrast, when a memory block for which the read count RC exceeds threshold count A is not present (in the case of No at step S1060), the memory controller 200 may terminate the process without performing a read reclaim operation.

The memory controller 200 may control the memory device 100 to move data stored in the selected memory block to another memory block at step S1070. In an embodiment, the memory controller 200 may control the memory device 100 to move valid data, among pieces of data stored in the selected memory block, to another memory block.

In an embodiment, when the error correction decoding operation of correcting error bits contained in the read data has failed, the memory controller 200 may control the memory device 100 to perform a plurality of recovery read operations of reading pages included in the selected memory block while changing the read voltage until the error correction decoding operation passes.

In detail, the memory controller 200 may control the memory device 100 to perform an N-th recovery read operation. Here, N may be a natural number, and may indicate the order in which the corresponding recovery read operation is performed. Details thereof will be described later with reference to FIG. 11.

The memory controller 200 may control the memory device 100 to perform the N-th recovery read operation at step S1031. In response to the control, the memory device 100 may output read data that is read through the N-th recovery read operation. The memory controller 200 may perform an error correction decoding operation of correcting error bits contained in the read data at step S1032.

Here, when the error correction decoding operation has passed (in the case of Yes at step S1033), the memory controller 200 may provide correction data Data_C, obtained by correcting the error bits contained in the read data, to the host 20 at step S1035. In contrast, when the error correction decoding operation has failed (in the case of No at step S1033), the memory controller 200 may control the memory device 100 to perform an N+1-th recovery read operation at steps S1034 and S1031. Thereafter, the above-described operation may be repeated.

When the recovery read count RRC indicating the number of times that the plurality of recovery read operations are performed exceeds threshold count B (in the case of Yes at step S1036), the memory controller 200 may select the memory block on which the plurality of recovery read operations are performed. In contrast, when the recovery read count RRC does not exceed threshold count B (in the case of No at step S1036), the memory controller 200 may terminate the process without performing a read reclaim operation.

The memory controller 200 may control the memory device 100 to move data stored in the selected memory block to another memory block at step S1037. Here, the data stored in the selected memory block may include correction data Data_C. In an embodiment, the memory controller 200 may control the memory device 100 to move valid data, among pieces of data stored in the selected memory block, to another memory block.

Figure 11A:
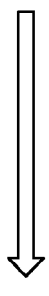
FIGS. 11A and 11B illustrate recovery read operations according to an embodiment of the present disclosure.
Figure 11B:
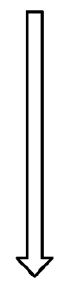

FIGS. 11A and 11B are diagrams illustrating recovery read operations according to an embodiment of the present disclosure.

Referring to FIGS. 11A and 11B, the plurality of recovery read operations may include a read retry operation, a history read operation, an optimal read voltage search (Vr Search) operation, and a soft read operation. For example, a first recovery read operation may be the read retry operation, a second recovery read operation may be the history read operation, a third recovery read operation may be the optimal read voltage search operation, and a fourth recovery read operation may be a soft read operation.

FIG. 11A shows that an error correction decoding operation corresponding to the first recovery read operation has failed and the second recovery read operation is performed, an error correction decoding operation corresponding to the second recovery read operation has failed and the third recovery read operation is performed, and an error correction decoding operation corresponding to the third recovery read operation has passed. In this case, the recovery read count RRC indicating the number of times that the plurality of recovery read operations are performed may be 3.

FIG. 11B shows that an error correction decoding operation corresponding to the first recovery read operation has failed and the second recovery read operation is performed, an error correction decoding operation corresponding to the second recovery read operation has failed and the third recovery read operation is performed, an error correction decoding operation corresponding to the third recovery read operation has failed and the fourth recovery read operation is performed, and an error correction decoding operation corresponding to the fourth recovery read operation has passed. In this case, the recovery read count RRC indicating the number of times that the plurality of recovery read operations are performed may be 4.

In an embodiment, when the voltage information V_Inf has a value of 0 indicating that an event in which the level of the input voltage Vcc drops to the reference level Vref or less has not occurred, the memory controller 200 may apply the first threshold count THB_1 to threshold count B.

Here, the first threshold count THB_1 is assumed to be 3. In the case of FIG. 11A, the memory controller 200 may not control the memory device 100 to perform a read reclaim operation because the recovery read count RRC corresponding to 3 (three times) does not exceed the first threshold count THB_1 corresponding to 3 (three times). In the case of FIG. 11B, the memory controller 200 may control the memory device 100 to perform the read reclaim operation because the recovery read count RRC corresponding to 4 (four times) exceeds the first threshold count THB_1 corresponding to 3 (three times).

In an embodiment, when the voltage information V_Inf has a value of 1 indicating that the event in which the level of the input voltage Vcc drops to the reference level Vref or less has occurred, the memory controller 200 may apply the second threshold count THB_2, lower than the first threshold count THB_1, to threshold count B.

Here, the second threshold count THB_2 is assumed to be 2. In the case of FIG. 11A, the memory controller 200 may control the memory device 100 to perform the read reclaim operation because the recovery read count RRC corresponding to 3 (three times) exceeds the second threshold count THB_2 corresponding to 2 (twice). In the case of FIG. 11B, the memory controller 200 may control the memory device 100 to perform the read reclaim operation because the recovery read count RRC corresponding to 4 (four times) exceeds the second threshold count THB_2 corresponding to 2 (twice).

In this way, the memory controller 200 may mitigate a condition in which the read reclaim operation is performed in the case where the input voltage Vcc provided to the memory device 100 is unstable, compared to the case where the input voltage Vcc is stable, thus securing the reliability of data. For example, when the memory system 10 determines that input voltage Vcc provided to the memory controller 200 is unstable, the memory controller 200 may reduce the value of the threshold count B from the first threshold count THB_1 to the second threshold count THB_2. As a result, the possibility of performing a read reclaim operation on a specific block may be increased compared to when the input voltage Vcc is stable, thereby securing the reliability of data stored in the specific block.

Figure 12:
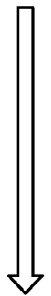
FIG. 12 is a diagram illustrating one of recovery read operations according to an embodiment of the present disclosure.

FIG. 12 is a diagram illustrating one of recovery read operations according to an embodiment of the present disclosure.

Referring to FIG. 12, the memory controller 200 may store a read retry table for performing a read retry operation. For example, the read retry table may be stored in the read operation controller 220. The read retry table may include indices and the levels of read voltages Vr1, Vr2, and Vr3 mapped to respective indices. The indices may indicate the order in which the levels of the read voltages are changed.

The memory controller 200 may control the memory device 100 to perform a read operation by changing the default levels of respective read voltages Vr1, Vr2, and Vr3 to the levels included in the read retry table. For example, the memory controller 200 may control the memory device 100 to perform the read operation by changing the levels of respective read voltages Vr1, Vr2, and Vr3 in the order of the indices included in the read retry table. In response to the control, the memory device 100 may perform the read operation using the read voltages having changed levels, and may output read data that is read through the read operation. The memory controller 200 may perform an error correction decoding operation of correcting error bits contained in the read data. When the error correction decoding operation has passed, the memory controller 200 may output correction data, obtained by correcting the error bits contained in the read data, to the host 20. For example, when the error correction decoding operation has failed, the memory controller 200 may control the memory device 100 to perform the read operation by changing the levels of respective read voltages Vr1, Vr2, and Vr3 mapped to indices in a subsequent order. The memory controller 200 may sequentially perform the above-described operations.

Meanwhile, when the error correction decoding operation performed on the read data received depending on the read retry operation has failed, the memory controller 200 may control the memory device 100 to perform a recovery read operation in a subsequent order. The recovery read operation in the subsequent order may be one of a history read operation, an optimal read voltage search operation, and a soft read operation.

For example, the history read operation may be an operation of storing the levels of read voltages used in a read operation when the previously performed error correction decoding operation has passed, and of performing the read operation using the read voltages having the stored levels. The optimal read voltage search operation may be an operation which allows the memory device 100 to detect a read voltage at which the number of memory cells having program states (e.g., P1 and P2) overlapping each other is minimized by applying read voltages to the selected page of the selected memory block while changing the read voltages, and which performs the read operation using the detected read voltage. The soft read operation may be an operation of allowing the memory device 100 to read the threshold voltages of memory cells included in the selected page of the selected memory block as various bits and to correct error bits. For example, the memory controller 200 may correct the error bits using a low density parity check (LDPC) code, a Bose-Chaudhuri-Hocquenghem (BCH) code, a turbo product code (TPC), a Reed-Solomon code, a convolution code, a recursive systematic code (RSC), or various types of coded modulation such as trellis-coded modulation (TCM) and block coded modulation (BCM), but embodiments of the present disclosure are not limited thereto.

Figure 13:
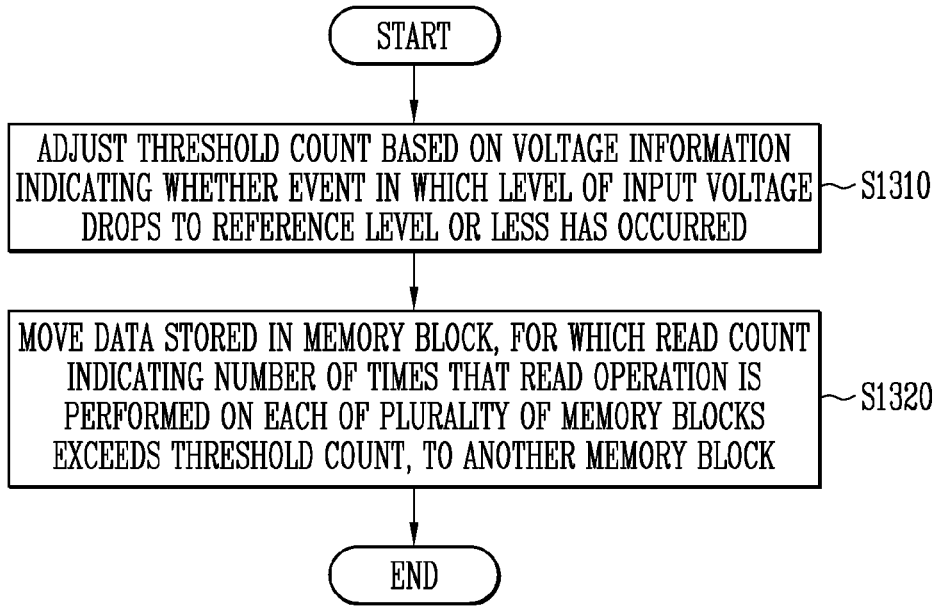
FIG. 13 is a flowchart illustrating a method of operating a memory system according to an embodiment of the present disclosure.

FIG. 13 is a flowchart illustrating a method of operating a memory system according to an embodiment of the present disclosure.

Referring to FIG. 13, the method of operating the memory system 10 according to an embodiment of the present disclosure may adjust a threshold count based on voltage information V_Inf indicating whether an event in which the level of an input voltage Vcc drops to a reference level Vref or less has occurred at step S1310.

Further, data stored in a memory block, for which a read count RC indicating the number of times that a read operation is performed on each of a plurality of memory blocks exceeds the threshold count, may be moved to another memory block included in the memory device 100 at step S1320. A read reclaim operation may not be performed on a memory block for which the read count RC does not exceed the threshold count.

Figure 14:
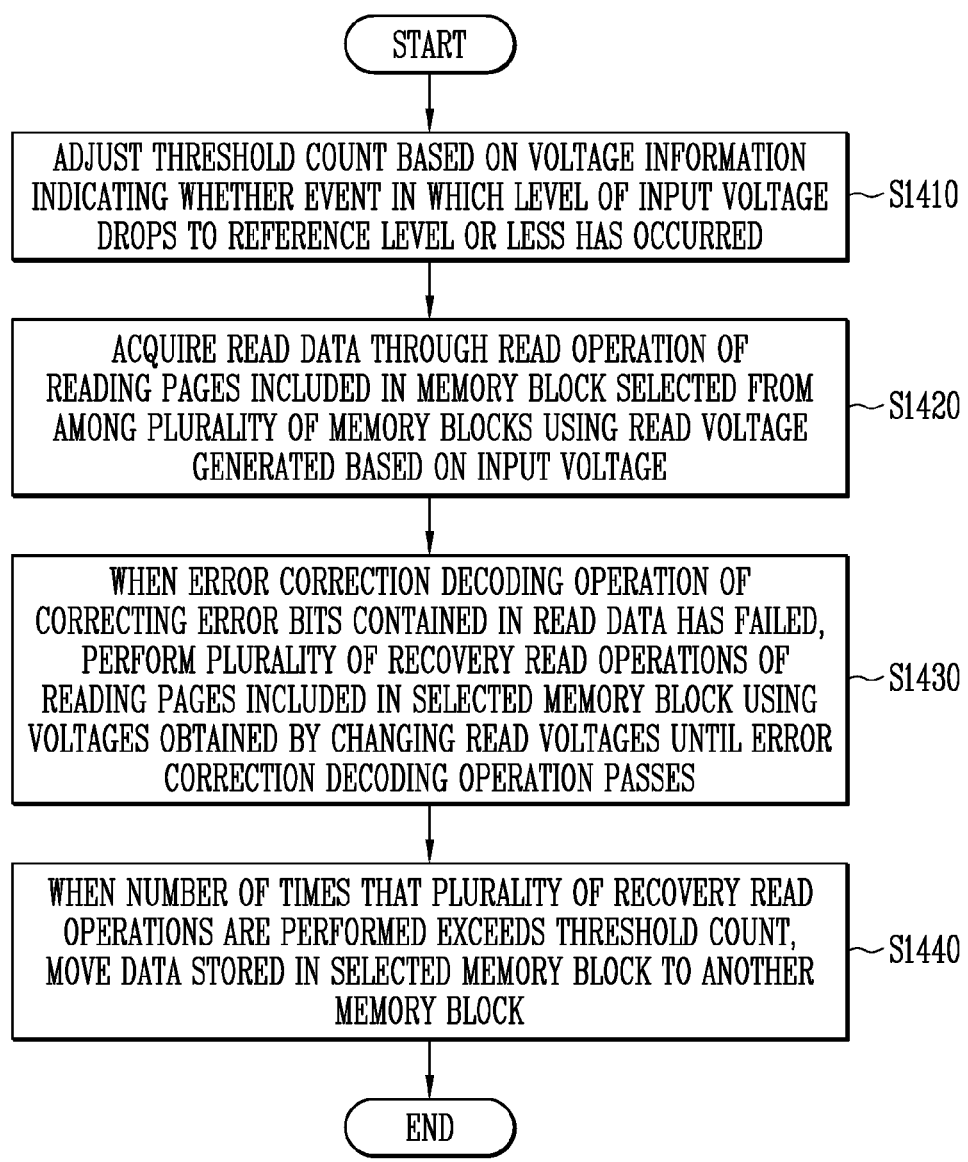
FIG. 14 is a flowchart illustrating a method of operating a memory system according to an embodiment of the present disclosure.

FIG. 14 is a flowchart illustrating a method of operating a memory system according to an embodiment of the present disclosure.

Referring to FIG. 14, the method of operating the memory system 10 according to an embodiment of the present disclosure may adjust a threshold count based on voltage information V_Inf indicating whether an event in which the level of an input voltage Vcc drops to a reference level Vref or less has occurred at step S1410.

Further, read data may be acquired through a read operation of reading pages included in a memory block, selected from among the plurality of memory blocks included in the memory device 100, using read voltages generated based on the input voltage Vcc at step S1420.

Further, when an error correction decoding operation of correcting error bits contained in the read data has failed, a plurality of recovery read operations of reading pages included in the selected memory block using voltages obtained by changing the read voltages may be performed until the error correction decoding operation passes at step S1430.

Furthermore, when a recovery read count RRC, indicating the number of times that the plurality of recovery read operations are performed, exceeds a threshold count, data stored in the selected memory block may be moved to another memory block included in the memory device 100 at step S1440. A read reclaim operation may not be performed on a memory block for which the recovery read count RRC does not exceed the threshold count.

Figure 15:
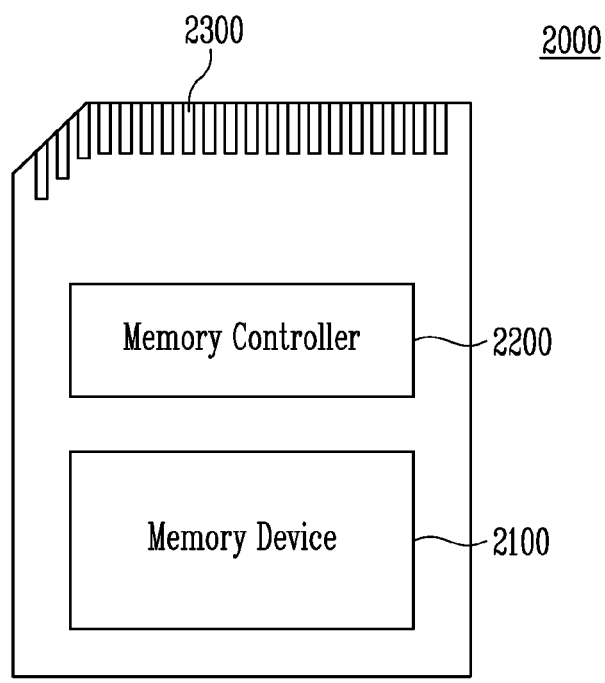
FIG. 15 is a block diagram illustrating a memory card to which a memory system according to an embodiment of the present disclosure is applied.

FIG. 15 is a block diagram illustrating a memory card to which a memory system according to an embodiment of the present disclosure is applied.

Referring to FIG. 15, a memory card 2000 may include a memory device 2100, a memory controller 2200, and a connector 2300.

The memory device 2100 may perform a program operation of storing data. In an embodiment, the memory device 2100 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM). The description of the memory device 100, made above with reference to FIG. 1, may be equally applied to the memory device 2100, and repeated descriptions thereof may be omitted for the interest of brevity.

The memory controller 2200 may access the memory device 2100. For example, the memory controller 2200 may control a program operation, a read operation, and an erase operation of the memory device 2100. The memory controller 2200 may provide an interface between the memory device 2100 and a host. The memory controller 2200 may run firmware for controlling the memory device 2100. The memory controller 2200 may be implemented in the same manner as the memory controller 200, described above with reference to FIG. 1.

In an embodiment, the memory controller 2200 may include components, such as a RAM, a processor, a host interface, a memory interface, and an error correction circuit.

The memory controller 2200 may communicate with an external device through the connector 2300. The memory controller 2200 may communicate with an external device (e.g., a host) based on a specific communication protocol. In an embodiment, the memory controller 2200 may communicate with the external device through at least one of various interface protocols such as universal serial bus (USB), multimedia card (MMC), embedded MMC (eMMC), peripheral component interconnection (PCI), PCI-express (PCI-E), an advanced technology attachment (ATA) protocol, a serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) protocols. In an embodiment, the connector 2300 may be defined by at least one of the above-described various communication protocols.

The memory device 2100 and the memory controller 2200 may be integrated into a single semiconductor device to form the memory card. For example, the memory device 2100 and the memory controller 2200 may be integrated into a single semiconductor device, and may then form a memory card such as a PC card (i.e., personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 16:
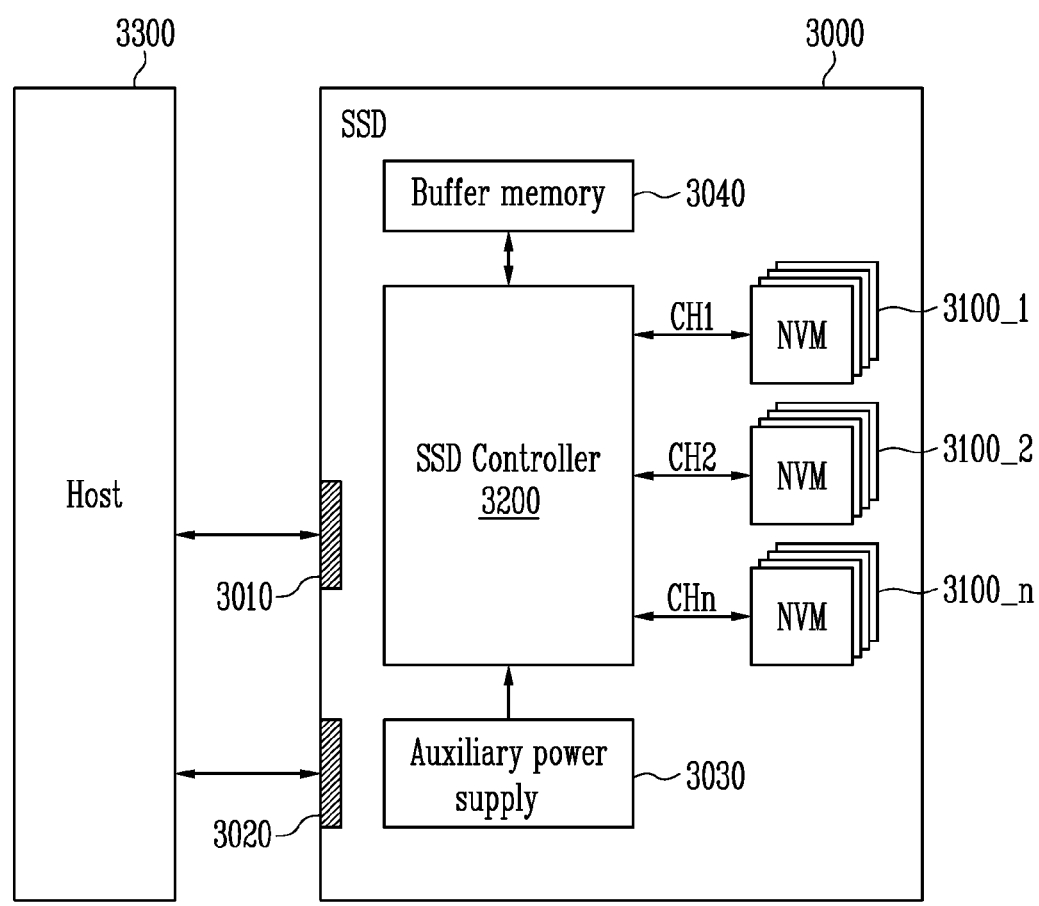
FIG. 16 is a block diagram illustrating a solid state drive (SSD) system to which a memory system according to an embodiment of the present disclosure is applied.

FIG. 16 is a block diagram illustrating a solid state drive (SSD) system to which a memory system according to an embodiment of the present disclosure is applied.

Referring to FIG. 16, the SSD system 3000 may include a plurality of flash memories 3100_1 to 3100_n, an SSD controller 3200, an auxiliary power supply 3030, and a buffer memory 3040.

The SSD system 3000 may exchange a signal with a host 3300 through a signal connector 3010, and may receive power through a power connector 3020.

Each of the plurality of flash memories 3100_1 to 3100_n may perform a program operation of storing data. In an embodiment, each of the plurality of flash memories 3100_1 to 3100_n may be implemented as any of various nonvolatile memory (NVM) devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM). The description of the memory device 100, made above with reference to FIG. 1, may be equally applied to each of the plurality of flash memories 3100_1 to 3100_n, and repeated descriptions thereof may be omitted for the interest of brevity.

The SSD controller 3200 may control the plurality of flash memories 3100_1 to 3100_n in response to signals received from the host 3300. In an embodiment, the signals may be signals based on the interfaces of the host 3300 and the SSD system 3000. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces. In accordance with an embodiment of the present disclosure, the SSD controller 3200 may perform the function of the memory controller 200, described above with reference to FIG. 1.

The auxiliary power supply 3030 may be coupled to the host 3300 through the power connector 3020. The auxiliary power supply 3030 may be supplied with power from the host 3300, and may be charged. The auxiliary power supply 3030 may supply the power of the SSD system 3000 when the supply of power from the host 3300 is not smoothly performed. In an embodiment, the auxiliary power supply 3030 may be located inside the SSD system 3000 or located outside the SSD system 3000. For example, the auxiliary power supply 3030 may be located in a main board, and may also provide auxiliary power to the SSD system 3000.

The buffer memory 3040 may function as a buffer memory of the SSD system 3000. For example, the buffer memory 3040 may temporarily store data received from the host 3300 or data received from the plurality of flash memories 3100_1 to 3100_n, or may temporarily store metadata (e.g., mapping tables) of the flash memories 3100_1 to 3100_n. The buffer memory 3040 may include volatile memories, such as DRAM, SDRAM, DDR SDRAM, LPDDR SDRAM, and GRAM, or nonvolatile memories, such as FRAM, ReRAM, STT-MRAM, and PRAM.

Figure 17:
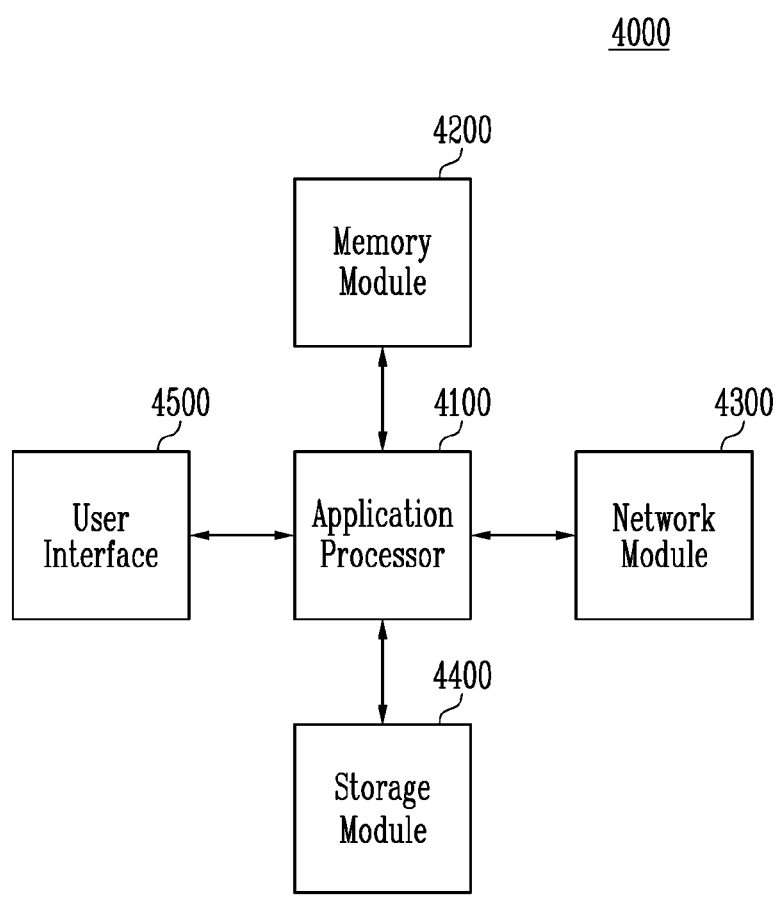
FIG. 17 is a block diagram illustrating a user system to which a memory system according to an embodiment of the present disclosure is applied.

FIG. 17 is a block diagram illustrating a user system to which a memory system according to an embodiment of the present disclosure is applied.

Referring to FIG. 17, a user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided in the form of a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR2 SDRAM, and LPDDR3 SDRAM or nonvolatile RAMs such as PRAM, ReRAM, MRAM, and FRAM. In an embodiment, the application processor 4100 and the memory module 4200 may be packaged based on a package-on-package (POP), and may then be provided as a single semiconductor package.

The network module 4300 may communicate with external devices. In an embodiment, the network module 4300 may support wireless communication, such as code division multiple access (CDMA), global system for mobile communication (GSM), wideband CDMA (WCDMA), CDMA-2000, time division multiple access (TDMA), long term evolution (LTE), Wimax, wireless LAN (WLAN), UWB, Bluetooth, or WiFi. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a 3D structure. In an embodiment, the storage module 4400 may be provided as a removable storage medium (removable drive), such as a memory card or an external drive of the user system 4000.

In an embodiment, the storage module 4400 may include a plurality of nonvolatile memory devices, each of which may be operated in the same manner as the memory device 100, described above with reference to FIG. 1. The storage module 4400 may be operated in the same manner as the memory system 10, described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light-emitting diode (OLED) display device, an active matrix OLED (AMOLED) display device, an LED, a speaker, and a monitor.

In accordance with embodiments of the present disclosure, there are provided a memory system which can improve the reliability and lifetime of data in an environment in which an unstable input voltage is provided, and a method of operating the memory system.

What is claimed is:

1. A memory system, comprising:
    a memory device including a plurality of memory blocks, the memory device being configured to output voltage information indicating whether an unstable state of an input voltage has occurred, the input voltage being provided to the memory device from an external power source; and
    a memory controller configured to store a read count indicating a number of times that one or more read operations are performed on each of the plurality of memory blocks, control the memory device to move data stored in a first memory block for which the read count exceeds a threshold count to a second memory block, and adjust the threshold count based on the voltage information.

2. The memory system according to claim 1, wherein the memory controller comprises a read reclaim operation controller configured to set the threshold count to a first threshold value, and to change the first threshold value to a second threshold value lower than the first threshold value when the voltage information indicates that the unstable state of the input voltage has occurred, and
    wherein the unstable state of the input voltage has occurred if a level of the input voltage drops to a reference level or less.

3. The memory system according to claim 2, wherein the memory controller further comprises:

a read operation controller configured to control the memory device to perform a read operation of reading a page included in a memory block selected from among the plurality of memory blocks, receive read data acquired through the read operation from the memory device, and perform an error correction decoding operation of correcting error bits included in the read data.

4. The memory system according to claim 3, wherein:
the selected memory block is the first memory block for which the read count exceeds the threshold count, among the plurality of memory blocks; and
the read reclaim operation controller controls the memory device to move data, obtained by correcting the error bits included in the read data, to the second memory block.

5. The memory system according to claim 3, wherein:
when the error correction decoding operation has failed, the read operation controller controls the memory device to perform a plurality of recovery read operations of reading pages included in the selected memory block while changing one or more read voltages until the error correction decoding operation passes; and
when a number of times the plurality of recovery read operations are performed exceeds a reference count, the read reclaim operation controller controls the memory device to move data stored in the selected memory block, including data corrected through the error correction decoding operation that has passed, and adjusts the reference count based on the voltage information.

6. The memory system according to claim 2, wherein the read reclaim operation controller stores a threshold count table including the first threshold value and the second threshold value, the first threshold value corresponding to a first value of the voltage information indicating that the unstable state of the input voltage has not occurred, the second threshold value corresponding to a second value of the voltage information indicating that the unstable state of the input voltage has occurred.

7. The memory system according to claim 1, wherein the memory controller controls the memory device to move valid data of the data stored in the first memory block for which the read count exceeds the threshold count, to the second memory block.

8. The memory system according to claim 1, wherein the memory controller comprises:
a voltage information storage configured to store the voltage information; and
a voltage information manager configured to receive the voltage information from the memory device and store the received voltage information in the voltage information storage.

9. The memory system according to claim 8, wherein the voltage information manager is configured to, when the voltage information indicating that the unstable state of the input voltage has occurred is not received from the memory device for a reference time period from a time point at which the unstable state occurred, update the value of the voltage information stored in the voltage information storage so as to indicate that the unstable state has not occurred.

10. The memory system according to claim 1, wherein the memory controller comprises:
a read count storage configured to store the read count.

11. A memory system, comprising:
a memory device including a plurality of memory blocks, the memory device being configured to output voltage information indicating whether an unstable state of an input voltage has occurred, the input voltage being provided to the memory device from an external power source; and
a memory controller configured to:
receive read data from the memory device, the read data being obtained through a read operation of reading pages included in a first memory block selected from among the plurality of memory blocks using one or more read voltages generated through the input voltage;
when an error correction decoding operation of correcting error bits included in the read data has failed, control the memory device to perform a plurality of recovery read operations of reading the pages included in the first memory block while changing the read voltages until the error correction decoding operation passes; and
when a number of times that the plurality of recovery read operations are performed exceeds a reference count, control the memory device to move data stored in the first memory block to a second memory block,
wherein the memory controller adjusts the reference count based on the voltage information.

12. The memory system according to claim 11, wherein the memory controller comprises a read reclaim operation controller configured to set the reference count to a first threshold value, and to change the first threshold value to a second threshold value lower than the first threshold value when the voltage information indicates that the unstable state of the input voltage has occurred, and
wherein the unstable state of the input voltage has occurred if a level of the input voltage drops to a reference level or less.

13. The memory system according to claim 12, wherein, when the number of times that the plurality of recovery read operations are performed exceeds the reference count, the read reclaim operation controller controls the memory device to move the data stored in the first memory block, including data corrected through the error correction decoding operation that has passed, to the second memory block.

14. The memory system according to claim 12, wherein, when the number of times the plurality of recovery read operations are performed exceeds the reference count, the read reclaim operation controller controls the memory device to move valid data of the data stored in the first memory block to the second memory block.

15. The memory system according to claim 12, wherein the read reclaim operation controller stores a threshold count table including the first threshold value and the second threshold value, the first threshold value corresponding to a first value of the voltage information indicating that the unstable state of the input voltage has not occurred, the second threshold value corresponding to a second value of the voltage information indicating that the unstable state of the input voltage has occurred.

16. The memory system according to claim 11, wherein the memory controller comprises:
a read operation controller configured to control the memory device to perform the read operation on the first memory block, receive the read data acquired through the read operation from the memory device, and perform the error correction decoding operation of correcting the error bits included in the read data.

17. The memory system according to claim 11, wherein the memory device comprises a voltage sensor configured to sense whether the unstable state of the input voltage has occurred and to output the voltage information, and wherein the unstable state of the input voltage has occurred if a level of the input voltage drops to a reference level or less.

18. The memory system according to claim 11, wherein the memory controller comprises:
   a voltage information storage configured to store the voltage information; and
   a voltage information manager configured to receive the voltage information from the memory device and store the received voltage information in the voltage information storage.

19. The memory system according to claim 18, wherein the voltage information manager is configured to, when the voltage information indicating that the unstable state of the input voltage has occurred is not received from the memory device for a reference time period from a time point at which the unstable state occurred, update the value of the voltage information stored in the voltage information storage so as to indicate that the unstable state has not occurred.

20. The memory system according to claim 11, wherein the plurality of recovery read operations comprise a read retry operation, a history read operation, an optimal read voltage search operation, and a soft read operation.

* * * * *